(12) United States Patent
Enya et al.

(10) Patent No.: US 8,476,615 B2
(45) Date of Patent: Jul. 2, 2013

(54) GAN-BASED SEMICONDUCTOR LIGHT EMITTING DEVICE AND THE METHOD FOR MAKING THE SAME

(75) Inventors: Yohei Enya, Itami (JP); Takashi Kyono, Itami (JP); Takamichi Sumitomo, Itami (JP); Katsushi Akita, Itami (JP); Masaki Ueno, Itami (JP); Takao Nakamura, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 50 days.

(21) Appl. No.: 13/295,840

(22) Filed: Nov. 14, 2011

(65) Prior Publication Data

US 2012/0061643 A1  Mar. 15, 2012

Related U.S. Application Data

(63) Continuation of application No. PCT/JP2011/050717, filed on Jan. 18, 2011.

(30) Foreign Application Priority Data

Jan. 18, 2010  (JP) ............................. P2010-008384

(51) Int. Cl.
  *H01L 29/06*  (2006.01)
(52) U.S. Cl.
  USPC ............................................. 257/13; 438/22
(58) Field of Classification Search
  USPC ............................................. 257/13; 438/22
  See application file for complete search history.

(56) References Cited

U.S. PATENT DOCUMENTS

| | | | | |
|---|---|---|---|---|
| 7,851,821 | B2 * | 12/2010 | Kyono et al. | 257/101 |
| 7,858,963 | B2 * | 12/2010 | Ueno et al. | 257/14 |
| 7,863,609 | B2 | 1/2011 | Ishibashi et al. | |
| 2008/0230766 | A1 | 9/2008 | Okamoto et al. | |
| 2008/0308815 | A1 | 12/2008 | Kasai et al. | |

(Continued)

FOREIGN PATENT DOCUMENTS

| | | |
|---|---|---|
| JP | 2008-235804 | 10/2008 |
| JP | 2009-018983 | 1/2009 |

(Continued)

OTHER PUBLICATIONS

Shen et al., "Auger Recombination in InGaN Measured by Photoluminescence," Applied Physics Letters, 91, pp. 141101-1-141101-3 (2007).

(Continued)

*Primary Examiner* — Douglas Menz
(74) *Attorney, Agent, or Firm* — Venable LLP; Michael A. Sartori

(57) ABSTRACT

A GaN-based semiconductor light emitting device 11a includes a substrate 13 composed of a GaN-based semiconductor having a primary surface 13a tilting from the c-plane toward the m-axis at a tilt angle α of more than or equal to 63 degrees and less than 80 degrees, a GaN-based semiconductor epitaxial region 15, an active layer 17, an electron blocking layer 27, and a contact layer 29. The active layer 17 is composed of a GaN-based semiconductor containing indium. The substrate 13 has a dislocation density of $1 \times 10^7$ $cm^{-2}$ or less. In the GaN-based semiconductor light emitting device 11a provided with the active layer containing indium, a decrease in quantum efficiency under high current injection can be moderated.

18 Claims, 18 Drawing Sheets

U.S. PATENT DOCUMENTS

| | | |
|---|---|---|
| 2009/0212277 A1 | 8/2009 | Akita et al. |
| 2010/0224963 A1 | 9/2010 | Ishibashi et al. |
| 2010/0230690 A1 | 9/2010 | Kyono et al. |
| 2010/0260224 A1 | 10/2010 | Yoshizumi et al. |
| 2011/0057200 A1 | 3/2011 | Kyono et al. |
| 2011/0084363 A1 | 4/2011 | Ishibashi et al. |
| 2011/0223701 A1 | 9/2011 | Kyono et al. |
| 2011/0253974 A1* | 10/2011 | Horie et al. ............... 257/13 |
| 2012/0104433 A1* | 5/2012 | Yoshizumi et al. ......... 257/94 |

FOREIGN PATENT DOCUMENTS

| | | |
|---|---|---|
| JP | 2009-200337 | 9/2009 |
| JP | 4333820 B1 | 9/2009 |
| JP | 2009-253047 | 10/2009 |
| JP | 2009-266963 | 11/2009 |
| JP | 4375497 B1 | 12/2009 |
| WO | WO-2009/125731 A1 | 10/2009 |

OTHER PUBLICATIONS

Delaney et al., "Auger Recombination Rates in Nitrides From First Principles," Applied Physics Letter, 94, pp. 191109-1-191109-3 (2009).

Han et al., "Effect of Electron Blocking Layer on Efficiency Droop in InGaN/GaN Multiple Quantum Well Light-Emitting Diodes," Applied Physics Letters, 94, pp. 231123-1-231123-3 (2009).

* cited by examiner (a)

(b)

(a)

(b)

(a)

(b)

GAN-BASED SEMICONDUCTOR LIGHT EMITTING DEVICE AND THE METHOD FOR MAKING THE SAME

CROSS-REFERENCE TO RELATED APPLICATION

This is a continuation application of a PCT application No. PCT/JP2011/050717 filed on Jan. 18, 2011, claiming the benefit of priorities from Japanese Patent application No. 2010-008384 filed on Jan. 18, 2010, and incorporated by reference in their entirety.

BACKGROUND OF THE INVENTION

1. Field of the Invention

The present invention relates to a GaN-based light emitting device and the method for making the same.

2. Related Background Art

Nonpatent Literature 1 discloses that a droop phenomenon in a GaN-based semiconductor light emitting device, that is, a decrease in internal quantum efficiency occurring when an injected current exceeds a threshold value, is attributed mainly to an Auger process. In the literature, an Auger coefficient is measured experimentally.

Nonpatent Literature 2 discloses that the droop phenomenon in a GaN-based semiconductor light emitting device is attributed mainly to the Auger process. In the literature, a first-principles calculation of an energy band diagram for a GaN-based semiconductor light emitting device indicates the existence of an energy level which resonantly induces the Auger process at a wavelength range of blue to green light.

Nonpatent Literature 3 discloses that the droop phenomenon in a GaN-based semiconductor light emitting device is attributed to localization of holes at an interface between an electron blocking layer and a contact layer, and a low efficiency of hole injection into an active layer due to the electron blocking layer.

Nonpatent Literature 1: Y. C. Shen et al., "Auger recombination in InGaN measured by photoluminescence," Applied Physics Letters, American Institute of Physics, Vol. 91, 141101 (2007)

Nonpatent Literature 2: Kris T. Delaney et al., "Auger recombination rates in nitrides from first principles," Applied Physics Letters, American Institute of Physics, Vol. 94, 191109 (2009)

Nonpatent Literature 3: Sang-Heon Han et al., "Effect of electron blocking layer on efficiency droop in InGaN/GaN multiple quantum well light-emitting diodes," Applied Physics Letters, American Institute of Physics, Vol. 94, 231123 (2009)

SUMMARY OF THE INVENTION

In recent years, light emitting devices of GaN-based semiconductor, which have a hexagonal crystal structure, have been extensively studied. The light emitting device is provided with a substrate composed of GaN-based semiconductor, a semiconductor layer of a first conductivity type (for example, n-type), an active layer, and a semiconductor layer of a second conductivity type (for example, p-type); these layers are epitaxially grown in sequence on a primary surface of the substrate. In general, the substrate has a c-plane of a GaN-based semiconductor crystal as the primary surface. The active layer is composed of, for example, a GaN-based semiconductor containing indium in the composition.

FIG. 13 is a graph showing an example of the relation between the excitation density and the internal quantum efficiency in such a light emitting device. As shown in FIG. 13, in a low current injection region (Region A in FIG. 13), an increase in current enhances the internal quantum efficiency in the light emitting device, while in a high current injection region (Region B in FIG. 13) where the injected current exceeds a threshold value, an increase in current reduces the internal quantum efficiency (droop phenomenon). The droop phenomenon is probably caused by the following three reasons:

(1) Auger Process

The Auger process indicates a three-body process in which excessive energy released by recombination of an electron and a hole is spent without for emitting light, but for exciting another electron into another higher energy level. The Auger process is one of the many-body effects, which is resonantly induced by a shortening average distance between excitons when the carrier density becomes high in the light emitting device.

FIG. 14 includes drawings explaining the Auger process. In a light emitting device, an electron (e1) falls into a hole, which releases energy as emitted light, the released energy being equal to an energy gap (Eg) between the energy levels of a conduction band and a valence band, as shown in Part (a) of FIG. 14. In a GaN-based semiconductor, however, another energy level (E3) exists that has an energy gap Δ from a bottom of a conduction band, the energy gap being equivalent to energy of light emission in the range of blue to green light. Thus, the energy released by the fall of the electron (e1) into the hole, which is equivalent to the energy gap (Eg) between the conduction band and the valence band, is spent for exciting another electron (e2) to the energy level (E3). Through these steps, electrons and holes are lost without emitting light, resulting in decreased internal quantum efficiency.

FIG. 15 is a graph showing the relation between the bandgap and the Auger coefficient in a semiconductor. As shown in FIG. 15, the Auger process, explained above, is remarkable in the case where the semiconductor has a bandgap in a certain range having a central value of about 2.5 eV (Range C in FIG. 15). The bandgap corresponds to an emission wavelength range of 440 nm to 540 nm; such a bandgap is achieved, for example, in a GaN-based semiconductor containing indium. Thus, a GaN-based semiconductor light emitting device containing indium in an active layer disadvantageously has a decrease in internal quantum efficiency due to the Auger process.

(2) Hole Depletion Due to Electron Blocking Layer

Part (a) of FIG. 16 shows an example of the energy band diagram in a GaN-based semiconductor light emitting device. The GaN-based light emitting device is provided with an n-type GaN layer, a multiquantum well (MQW) active layer disposed on the n-type GaN layer, an electron blocking layer (EBL) disposed on the active layer, and a p-type GaN layer disposed on the electron blocking layer. Part (b) of FIG. 16 is a graph showing a depth profile of the carrier density in the GaN-based semiconductor light emitting device. In Part (b) of FIG. 16, a line Ge and a line Gh represent an electron density and a hole density, respectively.

As shown in Part (a) of FIG. 16, high-current injection into the GaN-based semiconductor light emitting device having the structure explained above causes bending of the energy band (B1 and B2 in Part (a) of FIG. 16) caused by an applied voltage or a piezoelectric field. The band bending B1 at the interface between the electron blocking layer and the p-type GaN layer localizes holes at the interface (peak P3 in Part (b) of FIG. 16). The band bending B2 at the interface between the electron blocking layer and the active layer blocks the injection of holes into the active layer, resulting in decreased quantum efficiency.

FIG. 17 is a graph showing an example of the relation between the current density and the external quantum efficiency in the GaN-based semiconductor light emitting device shown in FIG. 16. As shown in FIG. 17, an increase in current density decreases the external quantum efficiency in the GaN-based semiconductor light emitting device, due to the band bending B1 and B2 explained above.

(3) High Dislocation Density Characteristic to GaN-Based Light Emitting Device

Part (a) of FIG. 18 is a conceptual diagram showing accumulation of carriers (Carr) around a dislocation D under relatively low current injection in the GaN-based semiconductor light emitting device, and Part (b) of FIG. 18 under relatively high current injection. In Parts (a) and (b) of FIG. 18, a vertical axis represents the value of energy, and the horizontal axis represents the position.

As shown in Part (a) of FIG. 18, under the relatively low current injection in the GaN-based semiconductor light emitting device (low injection region), carriers (Carr) can move without being trapped in the dislocation D, resulting in efficient light emission. This can be explained by a carrier localization effect due to nonuniformity of the indium distribution in the active layer of the GaN-based semiconductor containing indium. In contrast, under the relatively high current injection in the GaN-based semiconductor light emitting device (high injection region), the carriers (Carr) overflow from the localization site, disappearing without emitting light due to being trapped at the dislocation D. In a GaN-based semiconductor light emitting device, typically having a high dislocation density, the quantum efficiency is decreased by this mechanism.

An object of the present invention, conceived to address the problems above, is to provide a GaN-based semiconductor light emitting device having an active layer containing indium, in which a decrease in quantum efficiency under high current injection is moderated, and to provide a method for making the same.

To solve the problems mentioned above, a GaN-based semiconductor light emitting device according to the invention includes (a) a substrate comprising a first GaN-based semiconductor in which a primary surface of the substrate tilts from a plane normal to a reference axis [0 0 0 1] or [0 0 0 −1] of the first GaN-based semiconductor toward the m-axis of the first GaN-based semiconductor at a tilt angle in the range of 63 degrees to below 80 degrees; (b) a GaN-based semiconductor epitaxial region disposed on the primary surface; (c) an active layer disposed on the GaN-based semiconductor epitaxial region; (d) an electron blocking layer disposed on the active layer; and (e) a contact layer disposed on the electron blocking layer. The active layer comprises a second GaN-based semiconductor, and the second GaN-based semiconductor contains indium. The electron blocking layer comprises a third GaN-based semiconductor, and the bandgap of the third GaN-based semiconductor is larger than the bandgap of the second GaN-based semiconductor. The contact layer comprises a fourth GaN-based semiconductor, and the bandgap of the fourth GaN-based semiconductor is equal to or smaller than the bandgap of the third GaN-based semiconductor. The dislocation density in the first GaN-based semiconductor of the substrate is $1 \times 10^7$ cm$^{-2}$ or less.

According to the present invention, a method for making a GaN-based light emitting device includes the steps of (f) growing a GaN-based semiconductor epitaxial region on a primary surface of a wafer comprising a first GaN-based semiconductor; (g) growing an active layer on the GaN-based semiconductor epitaxial region; (h) growing an electron blocking layer on the active layer; and (i) growing a contact layer on the electron blocking layer. The primary surface of the wafer tilts from a plane normal to a reference axis [0 0 0 1] or [0 0 0 −1] of the first GaN-based semiconductor toward the m-axis of the first GaN-based semiconductor at a tilt angle in the range of 63 degrees to below 80 degrees. The active layer comprises a second GaN-based semiconductor, and the second GaN-based semiconductor contains indium. The electron blocking layer comprises a third GaN-based semiconductor, and the bandgap of the third GaN-based semiconductor is larger than the bandgap of the second GaN-based semiconductor. The contact layer comprises a fourth GaN-based semiconductor, and the bandgap of the fourth GaN-based semiconductor is equal to or smaller than the bandgap of the third GaN-based semiconductor. The dislocation density in the first GaN semiconductor of the wafer is $1 \times 10^7$ cm$^{-2}$ or less.

In the GaN-based semiconductor light emitting device and the method for making the GaN-based semiconductor light emitting device explained above, the substrate comprises the first GaN-based semiconductor. The primary surface of the substrate tilts from the plane normal to the axis [0 0 0 1] or [0 0 0 −1] of the first GaN-based semiconductor (c-plane) toward the m-axis of the first GaN-based semiconductor at a tilt angle in the range of 63 degrees to below 80 degrees. In the active layer disposed on the semipolar primary surface, anisotropic strain is induced. This anisotropic strain shifts the energy level E3 resonantly inducing an Auger process. This can prevent an Auger process for an energy gap Eg, which corresponds to emission of light ranging from blue to green. That is, since the Auger process is prevented for a possible bandgap of a GaN-based semiconductor which emits light ranging from blue to green, the droop phenomenon caused by the Auger process can be suppressed, and a decrease in quantum efficiency under high current injection can be moderated in a GaN-based semiconductor light emitting device including an active layer containing indium.

In the GaN-based semiconductor light emitting device and the method for making the GaN-based semiconductor light emitting device, the primary surface of the substrate tilts from the c-plane of the first GaN semiconductor toward the m-axis at a tilt angle in the range of 63 degrees to below 80 degrees. With this range of the tilt angles, since the piezoelectric field in the active layer is negative, the band bending B1 and B2 shown in FIG. 16(a) turns to the opposite direction. Thus, the localization of holes and the blocking of the hole injection into the active layer can be suppressed even under high current injection, thereby moderating a decrease in quantum efficiency.

In the GaN-based semiconductor light emitting device and the method for making the GaN-based semiconductor light emitting device, the dislocation density in the first GaN-based semiconductor of the substrate is $1 \times 10^{-7}$ cm$^{-2}$ or less. The GaN-based semiconductor epitaxial region, the active layer, the electron blocking layer, and the contact layer are disposed on the substrate comprising the high-quality GaN-based semiconductor having such a low dislocation density. Since the dislocation density is low in the GaN-based semiconductor light emitting device, trapping of carriers at dislocation can be reduced even under relatively high current injection, thereby moderating a decrease in quantum efficiency.

As explained above, the GaN-based semiconductor light emitting device and the method for making the GaN-based semiconductor light emitting device can solve the disadvantages of a conventional GaN-based semiconductor light emitting device, such as (1) the Auger process, (2) the depletion of holes caused by an electron blocking layer, and (3) a high dislocation density characteristic to a GaN-based light emitting device, thereby effectively moderating a decrease in quantum efficiency.

In the GaN-based semiconductor light emitting device and the method for making the GaN-based semiconductor light emitting device, the primary surface of the substrate may tilt at an angle of 70 degrees or more.

In the GaN-based semiconductor light emitting device and the method for making the GaN-based semiconductor light emitting device, the active layer may be provided so as to emit light of a wavelength range of 400 nm to 650 nm. The active layer may be provided so as to emit light of a wavelength range of 440 nm to 540 nm. The active layer may be provided so as to emit light of a wavelength range of 440 nm to 490 nm. The tilt angle of the substrate in the range of 63 degrees to below 80 degrees is particularly effective for the light emission in these wavelength ranges.

The GaN-based semiconductor light emitting device and the method for making the GaN-based semiconductor light emitting device may be characterized in that the second GaN-based semiconductor has a composition of $In_{x2}Al_{y2}Ga_{1-x2-y2}N$ ($0<x2<1$, $0<y2<1$). This enables a lattice constant in the active layer to be freely chosen within a certain range and thus the magnitude of anisotropic strain in the active layer to be controlled preferably. As a result, the energy gap A between the energy level E3 and the bottom energy of the conduction band, which are shown in Part (b) of FIG. 14, can be effectively controlled.

In the GaN-based semiconductor light emitting device and the method for making the GaN-based semiconductor light emitting device, the third GaN-based semiconductor may have a composition of $In_{x3}Al_{y3}Ga_{1-x3-y3}N$ ($0 \leq x3 \leq 1$, $0 \leq y3 \leq 1$), and a lattice constant may be equal to or smaller than the lattice constant in the first GaN-based semiconductor.

The GaN-based semiconductor light emitting device and the method for making the GaN-based semiconductor light emitting device may be characterized in that the GaN-based semiconductor light emitting device is a light emitting diode. In this case, the planar chip size of the light emitting diode is preferably smaller than 500 μm square. In the GaN-based semiconductor light emitting device and the method for making the GaN-based semiconductor light emitting device, since a decrease in quantum efficiency due to a droop phenomenon is effectively moderated, the device can have high efficiency of light emission under a high current density, resulting in downsizing of the chip.

In the GaN-based semiconductor light emitting device of the present invention and the method for making the same, since the GaN-based semiconductor light emitting device comprises an active layer containing indium, a decrease in quantum efficiency under high current injection can be moderated.

DESCRIPTION OF THE PREFERRED EMBODIMENTS

Figure 1:
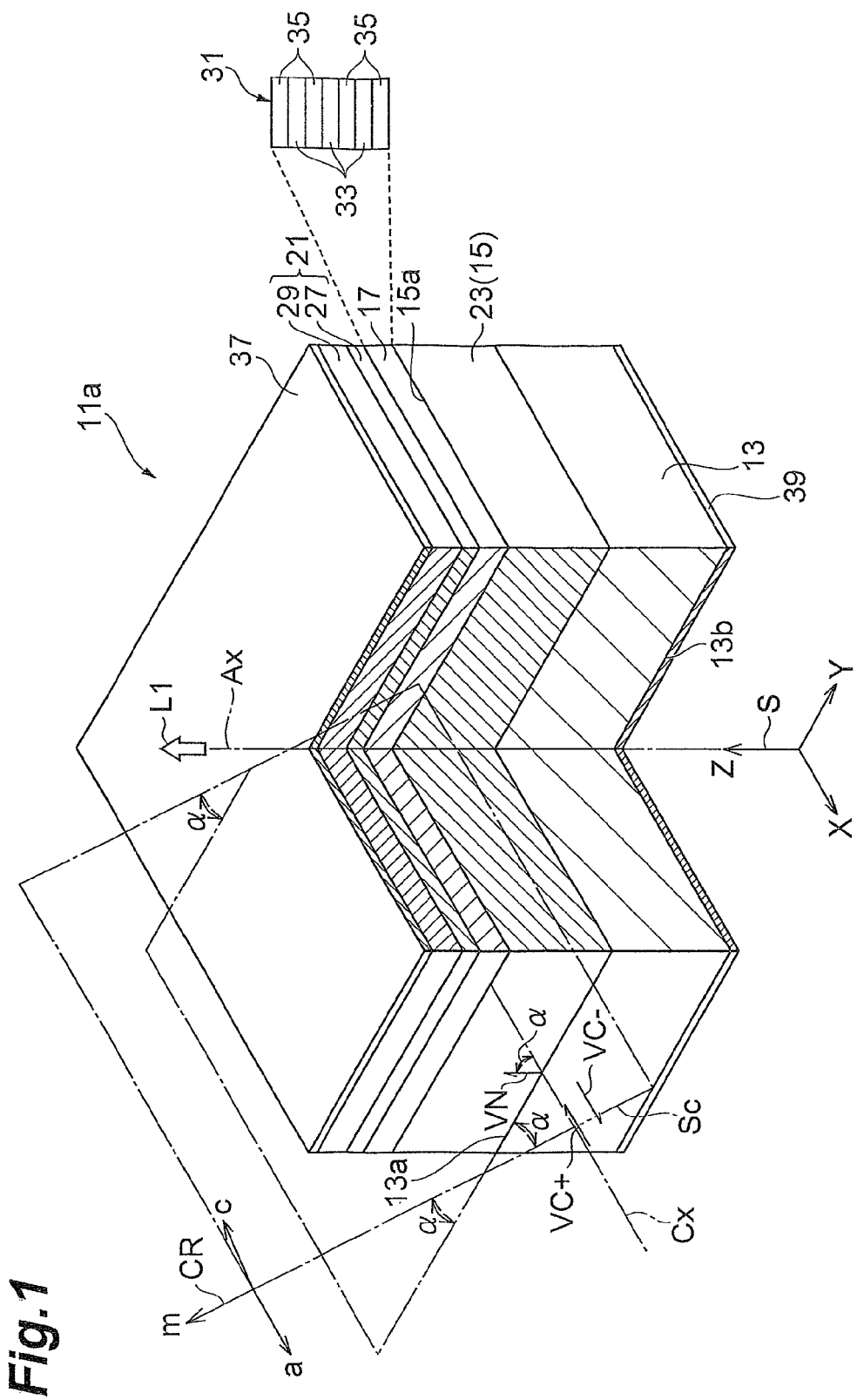
FIG. 1 is a schematic view showing an embodiment of a GaN-based semiconductor light emitting device according to the present invention.

A GaN-based semiconductor light emitting device and a method for making the same according to the present invention is explained in detail below, with reference to the accompanying drawings. In the explanation of the accompanying drawings, the elements are referred to by the same reference numerals to eliminate duplicated explanation. In the following description, crystallographic axes of a hexagonal crystal are represented by the a1-axis, a2-axis, a3-axis, and c-axis. A direction opposite to a positive direction along the crystallographic axis is represented by a minus sign (for example "−1") appended to the numeral (for example "1"). For example, the axis [0 0 0 −1] refers to the direction opposite to the axis [0 0 0 1].

FIG. 1 is a schematic view showing a structure of a GaN-based semiconductor light emitting device 11a according to an embodiment of the present invention. Examples of the GaN-based semiconductor light emitting device 11a include a light emitting diode.

A GaN-based semiconductor light emitting device 11a includes a substrate 13, a GaN-based semiconductor epitaxial region 15, and an active layer 17. The substrate 13 comprises a first GaN-based semiconductor. The first GaN-based semiconductor may be composed of GaN, InGaN, AlGaN, and InAlGaN. GaN, one of the binary GaN-based semiconductors, can have high-quality crystallinity and a stable primary surface as a substrate. The first GaN-based semiconductor of the substrate 13 has a dislocation density of $1 \times 10^7$ cm$^{-2}$ or less. The first GaN-based semiconductor may include, for example, AlN.

The c-axis of the substrate 13 extends along a plane Sc shown in FIG. 1. A coordinate system CR (c-axis, a-axis, m-axis) is illustrated on the plane Sc, each axis representing the crystallographic axis of the hexagonal GaN-based semiconductor. FIG. 1 also illustrates a reference axis Cx extending along the c-axis of the first GaN semiconductor. In the embodiment, the reference axis Cx refers to the axis [0 0 0 1] or the axis [0 0 0 −1] of the first GaN-based semiconductor. A vector VC+ along the reference axis Cx points in the direction of the axis [0 0 0 1], and a vector VC− in the direction of the axis [0 0 0 −1]. The primary surface 13a of the substrate 13 tilts from a plane (c-plane) normal to the reference axis Cx toward the m-axis of the first GaN-based semiconductor at a tilt angle α of more than or equal to 63 degrees and less than 80 degrees. Preferably, the tilt angle α is 70 degrees or more. The tilt angle α is defined by the normal vector VN of the primary surface 13a and the reference axis Cx in the substrate 13. In the embodiment, the angle α is equal to the angle defined by the vector VC+ and the vector VN. The tilt angle α is preferably 75 degrees. In this case, the primary surface 13a corresponds to the plane {20-21} of the hexagonal GaN-based semiconductor.

A GaN-based semiconductor epitaxial region 15 is provided on the primary surface 13a. The GaN-based semiconductor epitaxial region 15 may include one or more first conductive type GaN-based semiconductor layers. In the embodiment, the GaN-based semiconductor epitaxial region 15 includes an n-type GaN semiconductor layer 23.

In the GaN-based semiconductor light emitting device 11a, since the GaN-based semiconductor epitaxial region 15 is provided on the substrate 13, the crystallographic axes in the GaN-based semiconductor epitaxial region 15 are aligned to the crystallographic axes of the substrate 13. Thus, a primary surface 15a of the GaN-based semiconductor epitaxial region 15 also tilts from the plane normal to the reference axis Cx toward the m-axis at an angle of more than or equal to 63 degrees and less than 80 degrees.

An active layer 17 is provided on the GaN-based semiconductor epitaxial region 15. The active layer 17 is composed of a second GaN-based semiconductor containing indium. Preferably, the second GaN-based semiconductor has a composition of $In_{x2}Al_{y2}Ga_{1-x2-y2}N$ (0<x2<1, 0<y2<1). The direction normal to the surface of the active layer 17 tilts relative to the reference axis Cx.

Since the active layer 17 is provided on the GaN-based semiconductor epitaxial region 15, the crystallographic axes of the active layer 17 are aligned to the crystallographic axes of the substrate 13 through the GaN-based semiconductor epitaxial region 15. Thus, the primary surface of the active layer 17 also tilts from the plane normal to the reference axis Cx toward the m-axis at an angle of more than or equal to 63 degrees and less than 80 degrees.

The active layer 17 is preferably provided so as to emit light of a wavelength of 400 nm or more. The active layer 17 is preferably provided so as to emit light of a wavelength of 650 nm or less. In an active layer emitting light of a wavelength of 650 nm or more, desired crystalline quality is not readily achieved because of a large amount of indium in the composition. More preferably, the active layer 17 is provided so as to emit light of a wavelength of more than or equal to 440 nm and less than or equal to 540 nm. More preferably, the active layer 17 is provided so as to emit light of a wavelength of more than or equal to 440 nm and less than or equal to 490 nm. The tilt angle of the primary surface of the active layer 17 in the range of 63 degrees to below 80 degrees is particularly effective for the light emission in these wavelength ranges.

The active layer 17 may have a quantum well structure 31. The quantum well structure 31 may include well layers 33 and barrier layers 35 alternately arranged in the direction of a predetermined axis Ax. The well layers 33 and the barrier layers 35 are each composed of a second GaN-based semiconductor containing indium, for example, $In_{x2}Al_{y2}Ga_{1-x2-y2}N$ (0<x2<1, 0<y2<1). The bandgap of the barrier layer 35 is larger than the bandgap of the well layer 33. The n-type GaN semiconductor layer 23, the active layer 17, an electron blocking layer 27, and a contact layer 29 are arranged along the predetermined axis Ax. The direction of the reference axis Cx is different from the direction of the predetermined axis Ax.

FIG. 1 illustrates a coordinate system S. The primary surface 13a of the substrate 13 is normal to the Z-axis of the coordinate system S, and extends along the X-axis and the Y-axis. The X-axis points in the direction of the a-axis.

The GaN-based semiconductor light emitting device 11a includes a GaN-based semiconductor region 21 disposed on the active layer 17. The GaN-based semiconductor region 21 includes one or more second conductive type GaN-based semiconductor layers. The GaN-based semiconductor region 21 includes the electron blocking layer 27 provided on the active layer 17, and the contact layer 29 provided on the electron blocking layer 27. The electron blocking layer 27 is composed of a third GaN-based semiconductor. Preferably, the third GaN-based semiconductor has a bandgap larger than the bandgap of the second GaN-based semiconductor of the active layer 17. Preferably, the third GaN-based semiconductor is composed of p-type $In_{x3}Al_{y3}Ga_{1-x3-y3}N$ (0≦x3≦1, 0≦y3≦1), and more preferably the third GaN-based semiconductor is composed of p-type $In_{x3}Al_{y3}Ga_{1-x3-y3}N$ (0≦x3<1, 0<y3<1). The lattice constant of the third GaN-based semiconductor may be equal to or smaller than the lattice constant of the first GaN-based semiconductor of the substrate 13.

The contact layer 29 is composed of a fourth GaN-based semiconductor. The bandgap of the fourth GaN-based semiconductor is preferably equal to or less than the bandgap of the third GaN-based semiconductor. Preferably, the fourth GaN-based semiconductor is composed of p-type $In_{x4}Al_{y4}Ga_{1-x4-y4}N$ ($0 \leq x4 < 1$, $0 < y4 < 1$), and more preferably the fourth GaN-based semiconductor is composed of p-type $In_{x4}Al_{y4}Ga_{1-x4-y4}N$ ($0 \leq x4 < 1$, $0 < y4 < 1$).

Since the electron blocking layer 27 and the contact layer 29 are provided on the active layer 17, the crystallographic axes of the electron blocking layer 27 and the contact layer 29 are aligned to the crystallographic axes of the substrate 13 through the active layer 17 and the GaN-based semiconductor epitaxial region 15. Thus, the primary surfaces of the electron blocking layer 27 and the contact layer 29 also tilt from the plane normal to the reference axis Cx toward the m-axis at an angle of more than or equal to 63 degrees and less than 80 degrees.

The GaN-based semiconductor light emitting device 11a may include a first electrode 37 (for example, an anode) disposed on the contact layer 29. The first electrode 37 may include a transparent electrode covering the contact layer 29. The transparent electrode may be composed of, for example, Ni/Au. The GaN-based semiconductor light emitting device 11a may include a second electrode 39 (for example, a cathode) provided on a back surface 13b of the substrate 13. The second electrode 39 may be composed of, for example, Ti/Al. The active layer 17 emits light L1 in response to an external voltage applied between the electrodes 37 and 39. In the embodiment, the GaN-based semiconductor light emitting device 11a may include a surface-emitting device.

Figure 2:
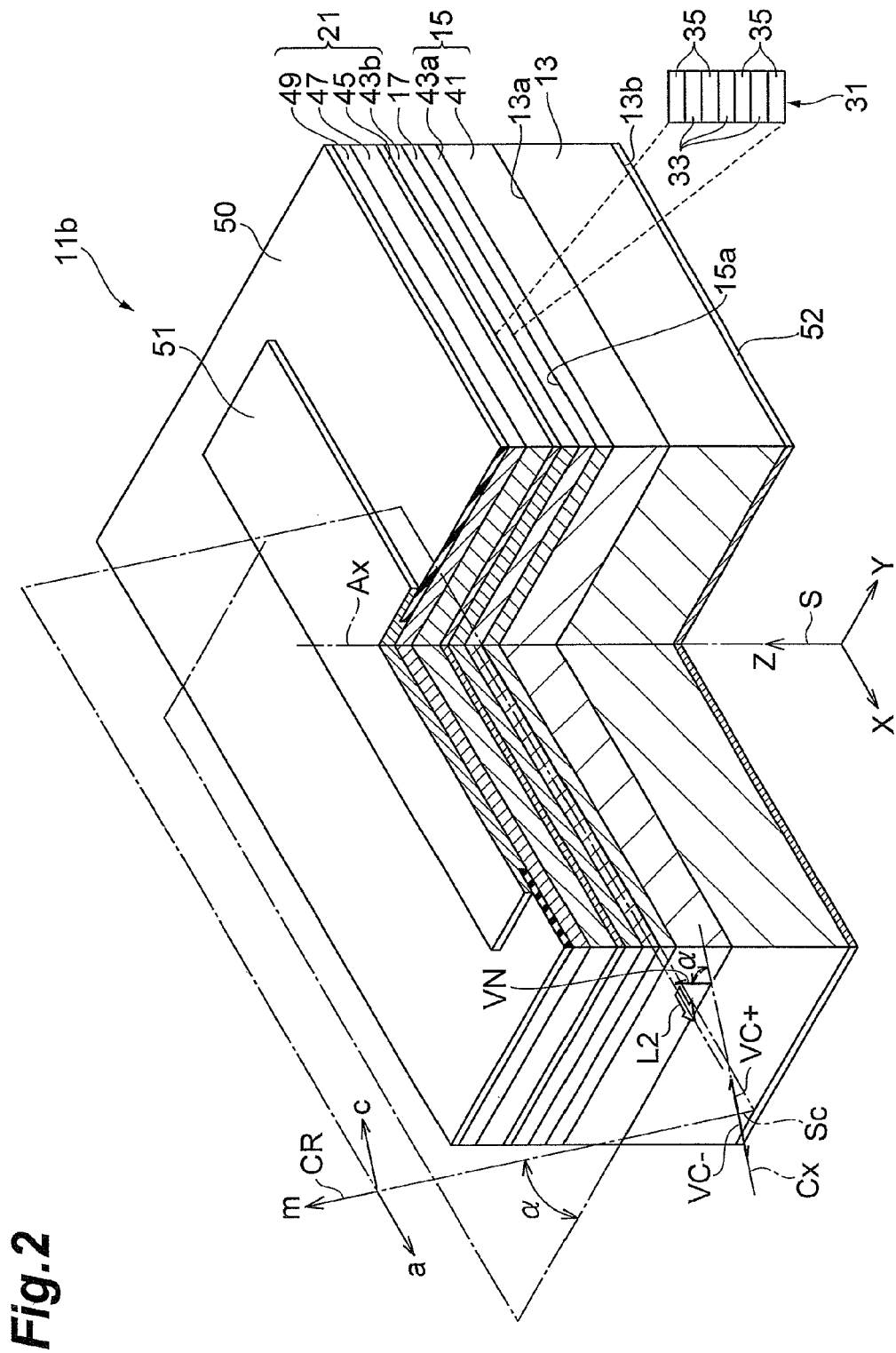
FIG. 2 is a schematic view showing another embodiment of the GaN-based semiconductor light emitting device according to the present invention.

FIG. 2 is a schematic view showing a structure of a GaN-based semiconductor light emitting device 11b according to another embodiment of the present invention. The GaN-based semiconductor light emitting device 11b may include, for example, a semiconductor laser. The GaN-based semiconductor light emitting device 11b includes a substrate 13, a GaN-based semiconductor epitaxial region 15, and an active layer 17, like the GaN-based semiconductor light emitting device 11a shown in FIG. 1.

The substrate 13 is composed of a first GaN-based semiconductor, for example, GaN, InGaN, AlGaN, or InAlGaN. The first GaN-based semiconductor of the substrate 13 has a dislocation density of $1 \times 10^7$ cm$^{-2}$ or less. The first GaN-based semiconductor may be composed of, for example, AlN.

The c-axis of the substrate 13 extends along a plane Sc shown in FIG. 2. A coordinate system CR (c-axis, a-axis, m-axis) is illustrated on the plane Sc. In FIG. 2, a reference axis Cx is also illustrated. In the embodiment, the reference axis Cx refers to the axis [0 0 0 1] or [0 0 0 -1] of the first GaN-based semiconductor. A vector VC+ along the reference axis Cx points in the direction of the axis [0 0 0 1], and a vector VC− in the direction of the axis [0 0 0 -1]. The primary surface 13a of the substrate 13 tilts from a plane (c-plane) normal to the reference axis Cx toward the m-axis of the first GaN-based semiconductor at a tilt angle α of more than or equal to 63 degrees and less than 80 degrees. The tilt angle α is defined by the normal vector VN of the primary surface 13a and the reference axis Cx in the substrate 13. In the embodiment, the angle α is equal to the angle defined by the vector VC+ and the vector VN.

The GaN-based semiconductor epitaxial region 15 is provided on the primary surface 13a. The GaN-based semiconductor epitaxial region 15 may include one or more first conductive type GaN-based semiconductor layers. In the embodiment, the GaN-based semiconductor epitaxial region 15 includes an n-type cladding layer 41 and a light guiding layer 43a arranged in the direction of the Ax axis (Z-direction). The n-type cladding layer 41 may be composed of, for example, AlGaN, GaN, or InAlGaN. The light guiding layer 43a may be composed of, for example, undoped InGaN. Since the n-type cladding layer 41 and the light guiding layer 43a are epitaxially grown on the primary surface 13a of the substrate 13, the crystallographic axes of the n-type cladding layer 41 and the light guiding layer 43a are aligned to the crystallographic axes of the substrate 13. Hence, the primary surface 15a of the GaN-based semiconductor epitaxial region 15 also tilts from the plane normal to the reference axis Cx toward the m-axis at an angle of more than or equal to 63 degrees and less than 80 degrees.

An active layer 17 is provided on the GaN-based semiconductor epitaxial region 15. The active layer 17 is composed of a second GaN-based semiconductor containing indium. Preferably, the second GaN-based semiconductor has a composition of $In_{x2}Al_{y2}Ga_{1-x2-y2}N$ ($0 < x2 < 1$, $0 < y2 < 1$). The direction normal to the surface of the active layer 17 tilts relative to the reference axis Cx.

Since the active layer 17 is provided on the GaN-based semiconductor epitaxial region 15, the crystallographic axes of the active layer 17 are aligned to the crystallographic axes of the substrate 13 through the GaN-based semiconductor epitaxial region 15. Hence, the primary surface of the active layer 17 also tilts from the plane normal to the reference axis Cx toward the m-axis at an angle of more than or equal to 63 degrees and less than 80 degrees.

The active layer 17 is preferably provided so as to emit light of a wavelength of 400 nm or more. The active layer 17 is preferably provided so as to emit light of a wavelength of 650 nm or less. In an active layer emitting light of a wavelength of 650 nm or more, desired crystalline quality is not readily achieved because of a large amount of indium in the composition. More preferably, the active layer 17 is provided so as to emit light of a wavelength of more than or equal to 440 nm and less than or equal to 540 nm. More preferably, the active layer 17 is provided so as to emit light of a wavelength of more than or equal to 440 nm and less than or equal to 490 nm. The tilt angle of the primary surface of the active layer 17 in the range of 63 degrees to below 80 degrees is particularly effective for light emission in these wavelength ranges.

The active layer 17 may have a quantum well structure 31. The quantum well structure 31 includes well layers 33 and barrier layers 35 alternately arranged in the direction of a predetermined axis Ax. The well layers 33 and the barrier layers 35 are each composed of a second GaN-based semiconductor containing indium, for example, $In_{x2}Al_{y2}Ga_{1-x2-y2}N$ ($0 < x2 < 1$, $0 < y2 < 1$). The bandgap of the barrier layer 35 is larger than the bandgap of the well layer 33. The thickness of the well layer 33 may range, for example, from 0.5 nm to 10 nm. The amount of indium in the composition may range from 0.01 to 0.50.

The GaN-based semiconductor light emitting device 11b has a GaN-based semiconductor region 21 provided on the active layer 17. The GaN-based semiconductor region 21 includes one or more GaN-based semiconductor layers. In the embodiment, the GaN-based semiconductor region 21 includes a light guiding layer 43b, an electron blocking layer 45, a cladding layer 47, and a contact layer 49, arranged in the Z-direction.

The light guiding layer 43b may be composed of, for example, undoped InGaN. The electron blocking layer 45 is composed of a third GaN-based semiconductor. Preferably, the third GaN-based semiconductor has a bandgap larger than the bandgap of the second GaN-based semiconductor of the active layer 17. Preferably, the third GaN-based semiconductor is composed of p-type $In_{x3}Al_{y3}Ga_{1-x3-y3}N$ ($0 \leq x3 \leq 1$, $0 \leq y3 \leq 1$), and more preferably the third GaN-based semiconductor is composed of p-type $In_{x3}Al_{y3}Ga_{1-x3-y3}N$ ($0 \leq x3 < 1$, $0 < y3 < 1$). The lattice constant of the third GaN-based semiconductor may be equal to or smaller than that of the first GaN-based semiconductor of the substrate 13. The cladding layer 47 may be composed of, for example, p-type AlGaN, p-type GaN, or p-type InAlGaN.

The contact layer 49 is composed of a fourth GaN-based semiconductor. The bandgap of the fourth GaN-based semiconductor is preferably equal to or less than the bandgap of the third GaN-based semiconductor. Preferably, the fourth GaN-based semiconductor is composed of p-type $In_{x4}Al_{y4}Ga_{1-x4-y4}N$ ($0 \leq x4 \leq 1$, $0 \leq y4 \leq 1$), and more preferably the fourth GaN-based semiconductor is composed of p-type $In_{x4}Al_{y4}Ga_{1-x4-y4}N$ ($0 \leq x4 < 1$, $0 < y4 < 1$).

Since the electron blocking layer 45, the cladding layer 47, and the contact layer 49 are provided on the active layer 17, the crystallographic axes of the electron blocking layer 45, the cladding layer 47, and the contact layer 49 are aligned to the crystallographic axes of the substrate 13 through the active layer 17 and the GaN-based semiconductor epitaxial region 15. Thus, the primary surfaces of the electron blocking layer 45, the cladding layer 47, and the contact layer 49 also tilt from the plane normal to the reference axis Cx toward the m-axis at an angle of more than or equal to 63 degrees and less than 80 degrees.

The GaN-based semiconductor light emitting device 11b may include a first electrode 51 (for example, an anode) provided on the contact layer 49. The first electrode 51 is connected to the contact layer 49 through a stripe window of an insulating layer 50 covering the contact layer 49. The first electrode 51 may be composed of, for example, Ni/Au. The GaN-based semiconductor light emitting device 11b may include a second electrode 52 (for example, a cathode) provided on a back surface 13b of the substrate 13. The second electrode 52 may be composed of, for example, Ti/Al.

The active layer 17 emits light L2 in response to an external voltage applied between the electrodes 51 and 52. In the embodiment, the GaN-based semiconductor light emitting device may include an edge emitting device. In the active layer 17, the Z component (the component parallel to the predetermined axis Ax) of the piezoelectric field is aligned opposite to the direction from the p-type GaN-based semiconductor layers 45, 47 and 49 toward the n-type cladding layer 41. In the GaN-based semiconductor light emitting device 11b, since the Z component of the piezoelectric field is aligned opposite to the electric field induced by the external voltage applied between the electrodes 51 and 52, the wavelength shift of emitted light can be reduced.

Figure 3:
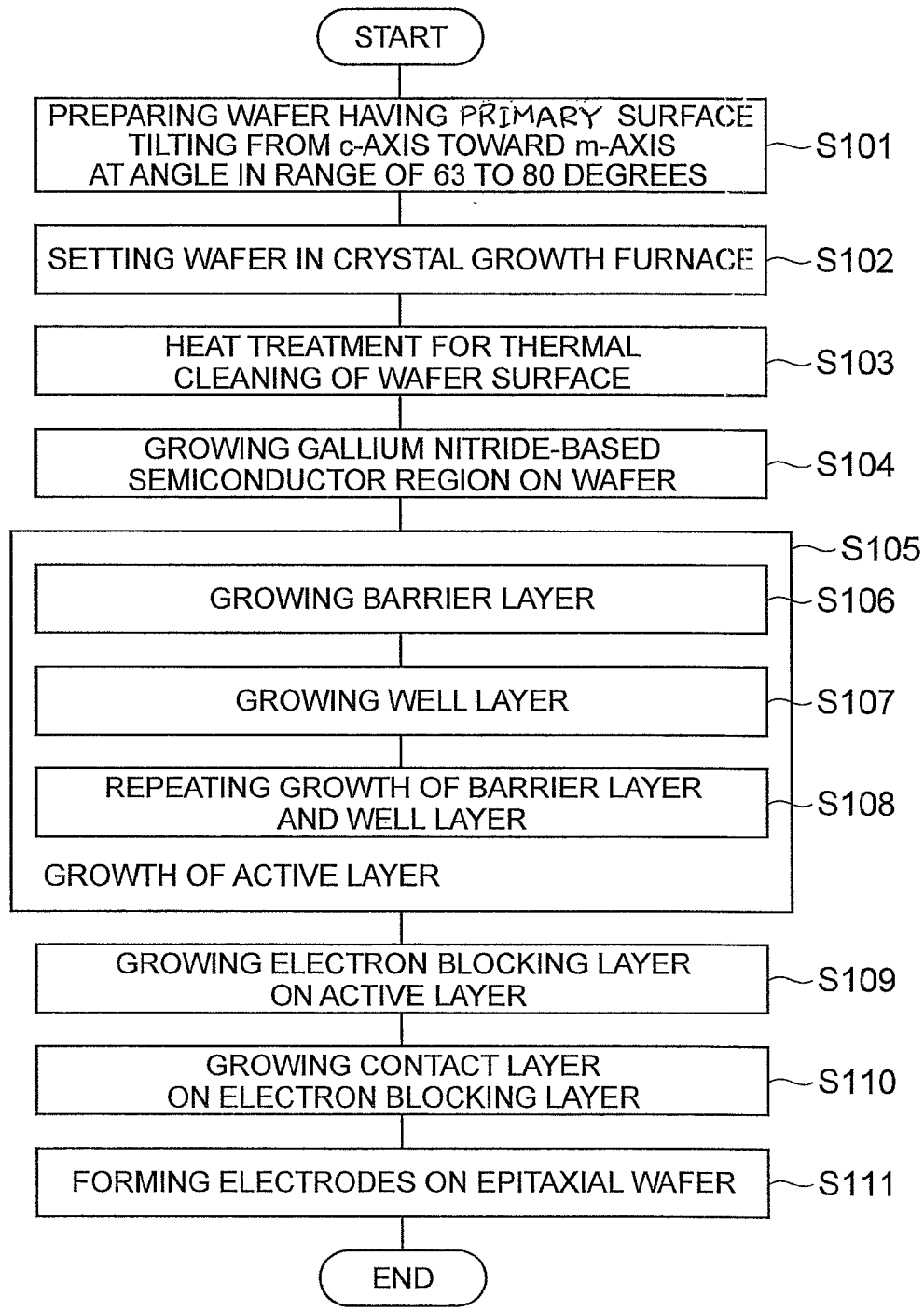
FIG. 3 is a flowchart showing a method for making a GaN-based semiconductor light emitting device.

A method for making the GaN-based semiconductor light emitting device 11a shown in FIG. 1 is explained below. FIG. 3 is a flowchart showing the steps of making the GaN-based semiconductor light emitting device 11a. In the steps shown in FIG. 3, the GaN-based semiconductor light emitting device 11a is fabricated by metalorganic vapor phase epitaxy. For the epitaxial growth, trimethylgallium (TMG), trimethylindium (TMI), trimethylaluminum (TMA), ammonia ($NH_3$), silane ($SiH_4$), and Bis(cyclopentadienyl)magnesium ($Cp_2Mg$) are used as materials.

First, a wafer composed of a first GaN-based semiconductor is prepared in Step S101. The primary surface of the wafer tilts from a plane normal to the reference axis referring to the crystallographic axis [0 0 0 1] or [0 0 0 –1] of a GaN-based semiconductor (i.e., c-plane) at a tilt angle of more than or equal to 63 degrees and less than 80 degrees. The dislocation density in the first GaN-based semiconductor of the wafer is $1 \times 10^7$ m$^{-2}$ or less. This wafer corresponds to the substrate 13 in the embodiment explained above.

Next, the wafer prepared in Step S101 is set in a growth furnace (Step S102). In the growth furnace, subsequent to a thermal treatment of the wafer for thermal cleaning of its primary surface (Step S103), a GaN-based semiconductor epitaxial region 15 is grown on the primary surface of the wafer (Step S104). For example, a Si-doped GaN layer is grown at 1000° C. under supply of TMG, $NH_3$, and $SiH_4$ into the growth furnace. The thickness of the Si-doped GaN layer is, for example, 2 μm.

Subsequently, an active layer 17 is grown on the GaN-based semiconductor epitaxial region 15 (Step S105). First, a barrier layer 35 composed of $In_{x2}Al_{y2}Ga_{1-x2-y2}N$ ($0 < x2 < 1$, $0 < y2 < 1$) is grown on the GaN-based semiconductor epitaxial region 15 (Step S106). For example, the barrier layer 35 of undoped InAlGaN is grown by supplying TMG, TMI, TMA, and $NH_3$ into the growth furnace. The thickness of the barrier layer 35 is, for example, 15 nm. Next, a well layer 33 of $In_{x2}Al_{y2}Ga_{1-x2-y2}N$ ($0 < x2 < 1$, $0 < y2 < 1$) having a bandgap smaller than the bandgap of the barrier layer 35 is grown on the bather layer 35 (Step S107). For example, the well layer 33 of undoped InAlGaN is grown by supplying TMG, TMI, TMA, and $NH_3$ into the growth furnace (Step S107). The thickness of the well layer 33 is, for example, 3 nm. The amounts of In and Al in the composition of the undoped InAlGaN well layer 33 are adjusted to achieve a desired emission wavelength. A multiquantum well structure 31 is then formed by alternately growing the barrier layers 35 and the well layers 33 (Step S108).

Subsequently, a GaN-based semiconductor region 21 is grown on the active layer 17. First, an electron blocking layer 27 of p-type $In_{x3}Al_{y3}Ga_{1-x3-y3}N$ ($0 \leq x3 < 1$, $0 < y3 < 1$) is grown on the active layer 17 (Step S109). The electron blocking layer 27 of p-type AlGaN is grown, for example, by supplying TMG, TMA, $NH_3$, and $Cp_2Mg$ into the growth furnace. The electron blocking layer 27 is, for example, 20 nm thick. Preferably, the bandgap of the electron blocking layer 27 is larger than the bandgap of the active layer 17. Preferably, the lattice constant of the electron blocking layer 27 is equal to or less than the lattice constant of the substrate 13. Next, a contact layer 29 composed of p-type $In_{x4}Al_{y4}Ga_{1-x4-y4}N$ ($0 \leq x4 \leq 1$, $0 \leq y4 \leq 1$) is grown on the electron blocking layer 27 (Step S110). The contact layer 29 of p-type GaN is grown, for example, by supplying TMG, $NH_3$, and $Cp_2Mg$ into the growth furnace. The contact layer 29 is, for example, 50 nm thick. Preferably, the bandgap of the contact layer 29 is equal to or smaller than the bandgap of the electron blocking layer 27.

Subsequently, electrodes are formed on the epitaxial wafer prepared in the steps above (Step S111). First, a transparent electrode (Ni/Au) 37 is formed on the contact layer 29. A pad electrode (Ti/Au) is then formed on the transparent electrode 37. An electrode (Ti/Al) 39 is also formed on a back surface of the substrate. The electrodes 37 and 39 are heat-treated (annealed). Through the steps explained above, the GaN-based semiconductor light emitting device 11a according to the embodiment is completed.

Functions and effects of the GaN-based semiconductor light emitting devices 11a and 11b and the method for making the GaN-based semiconductor light emitting device 11a are explained below.

In the GaN-based semiconductor light emitting devices 11a and 11b, and the method for making the GaN-based semiconductor light emitting device 11a explained above, the substrate 13 (or the wafer) of the first GaN-based semiconductor is used. The primary surface 13a of the substrate 13 tilts from the plane normal to the axis [0 0 0 1] or [0 0 0 −1] of the first GaN semiconductor (i.e., c-plane) toward the m-axis at a tilt angle α of more than or equal to 63 degrees and less than 80 degrees. In the active layer 17 disposed on the semipolar primary surface 13a, anisotropic strain is induced.

Figure 4:
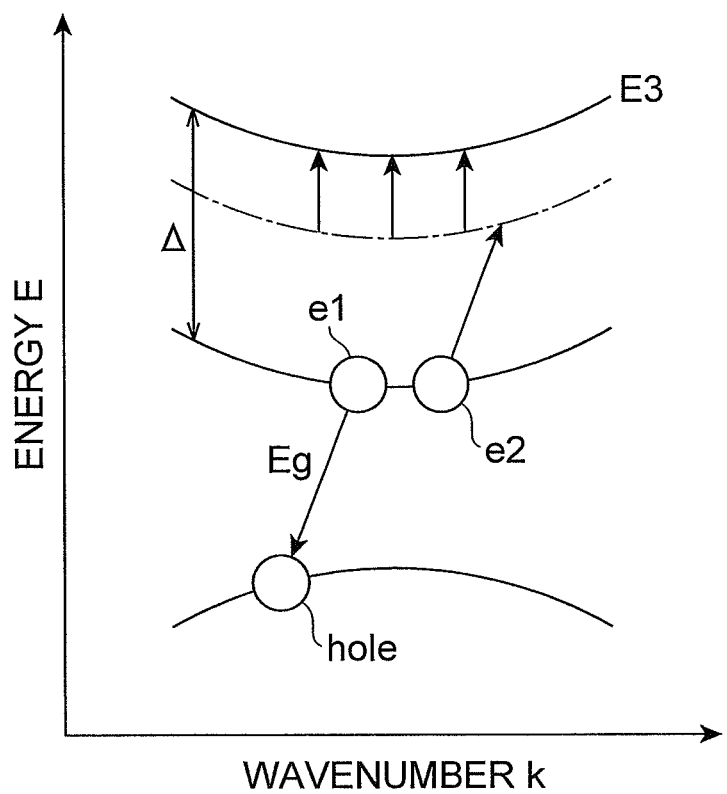
FIG. 4 is a conceptual diagram illustrating a mechanism of a change in the energy gap Δ between the bottom energy of a conduction band and the energy level resonantly inducing an Auger process, by shifting the energy level in the energy band diagram.

As shown in FIG. 4, this anisotropic strain shifts the energy level E3 resonantly inducing an Auger process, resulting in a change in the energy gap Δ between the energy level E3 and the bottom of the conduction band. Such energy gap Eg of the GaN-based semiconductor does not cause an Auger process. That is, the Auger process is prevented within a possible bandgap range of the GaN-based semiconductor containing indium which emits light ranging from blue to green. Hence, since the droop phenomenon caused by the Auger process can be suppressed, a decrease in quantum efficiency under high current injection can be moderated in the GaN-based semiconductor light emitting devices 11a and 11b provided with the active layer 17 containing indium.

Figure 14:
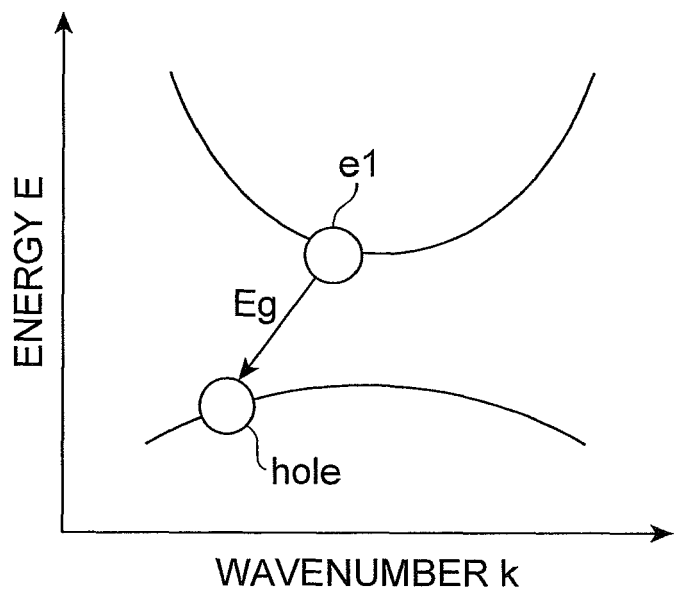
FIG. 14 is a drawing explaining an Auger process.
Figure 14:
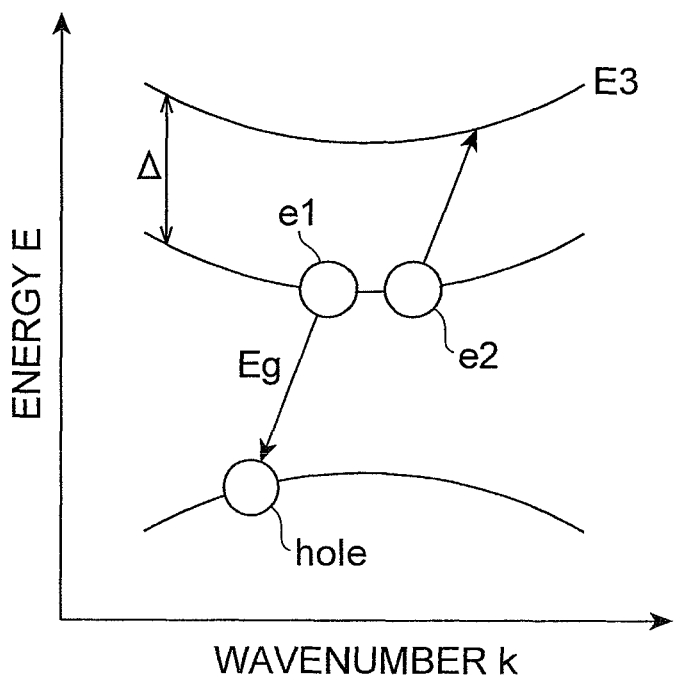
Figure 15:
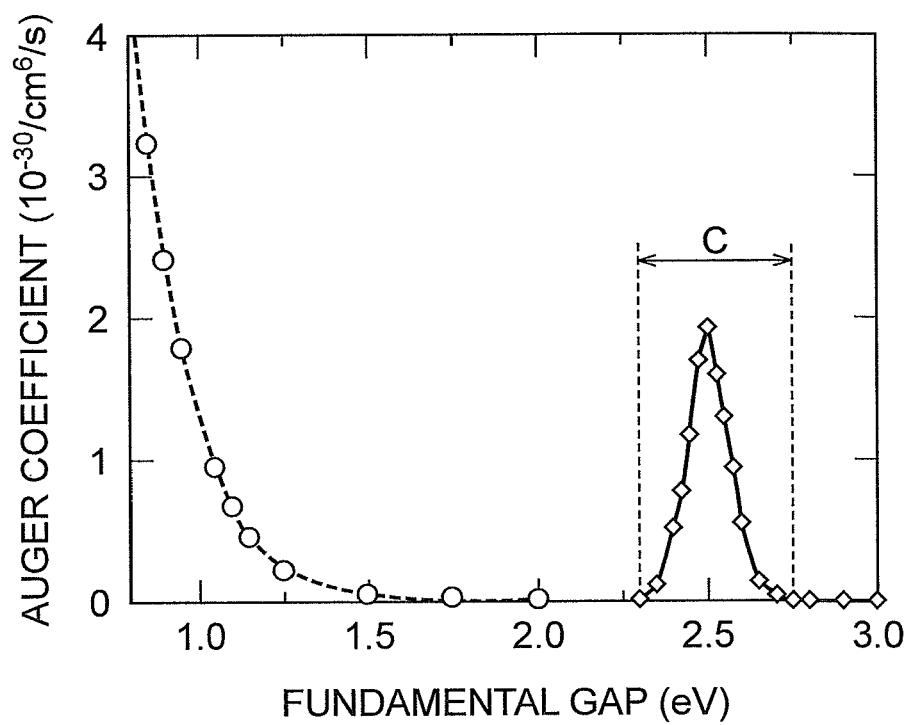
FIG. 15 is a graph showing the relation between the bandgap and the Auger coefficient in a semiconductor.

The amplitude of the anisotropic strain induced in the well layer 33 can be controlled by adjusting compositions of the well layer 33 and the barrier layer 35. The well layer 33 normally has compressive strain, but may have tensile strain by changing the compositions. This may modify the band structure of the conduction band. For example, the energy gap Δ shown in FIG. 4 and Part (b) of FIG. 14 can be controlled within the range of Δ=2.5±1 eV, for example. Thus, the droop phenomenon can be effectively suppressed for the emission at a wavelength range of 440 nm to 540 nm.

Figure 5:
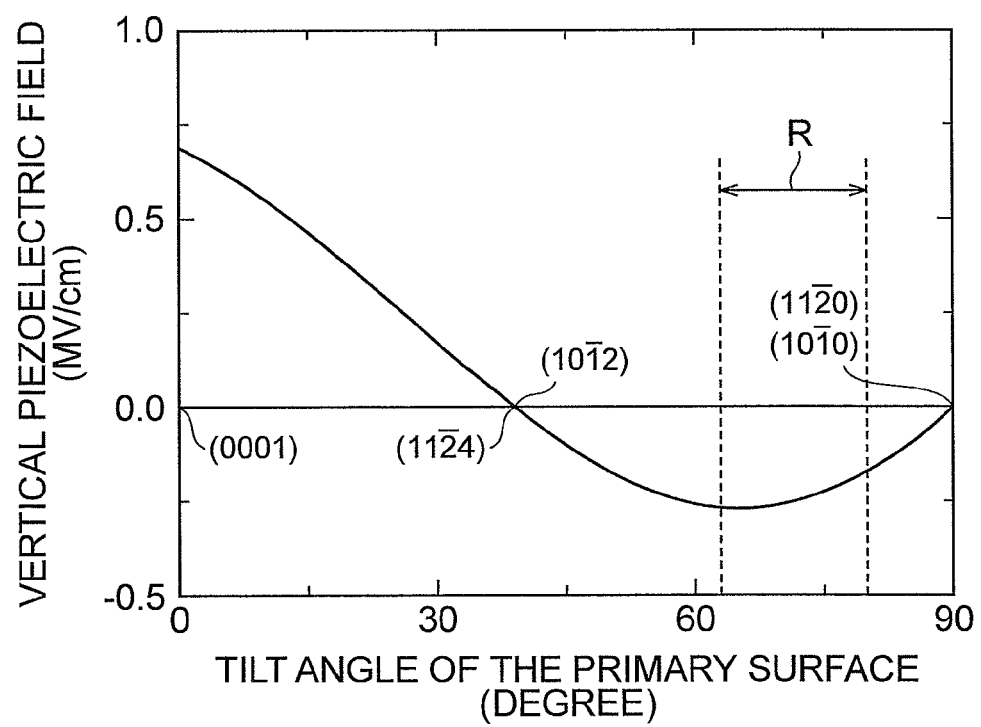
FIG. 5 is a graph showing the relation between the tilt angle of a primary surface and the amplitude of a piezoelectric filed in an active layer.
Figure 16:
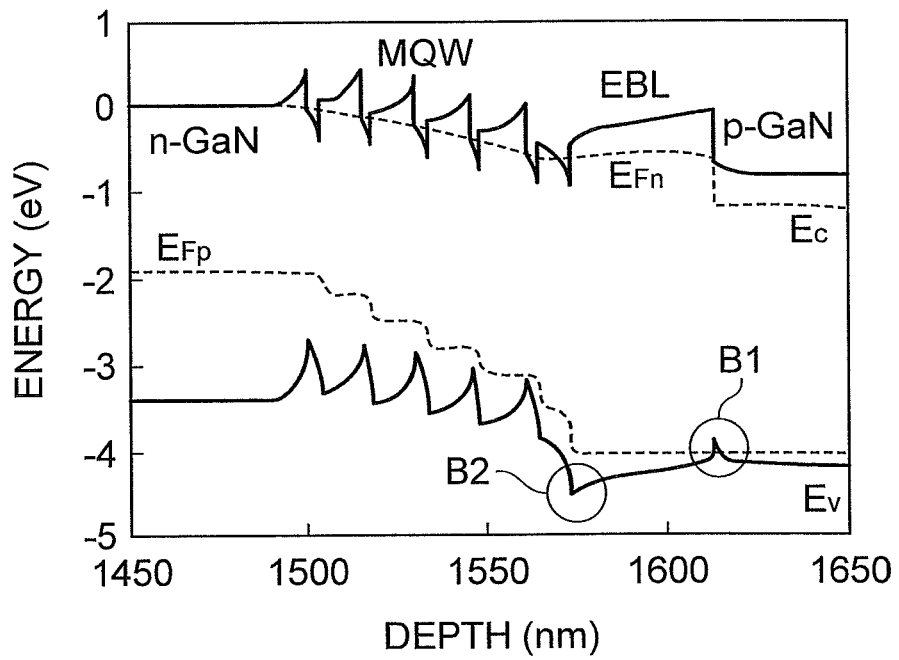
FIG. 16 is a drawing explaining an example energy band diagram for a conventional GaN-based semiconductor light emitting device (Part (a)), and a graph showing the depth profile of a carrier density distribution in a conventional GaN-based semiconductor light emitting device (Part (b)).
Figure 16:
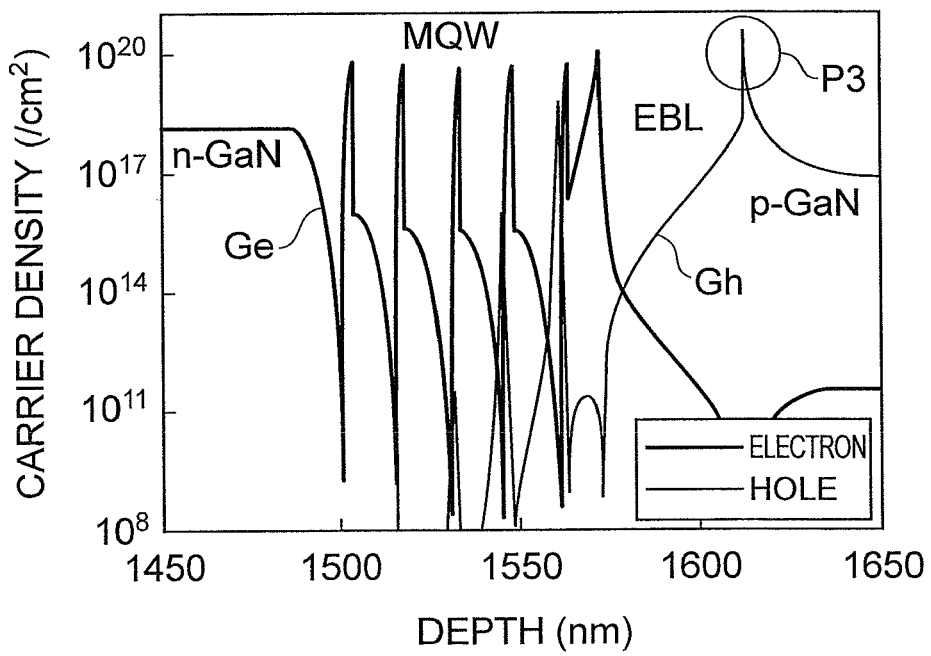
Figure 17:
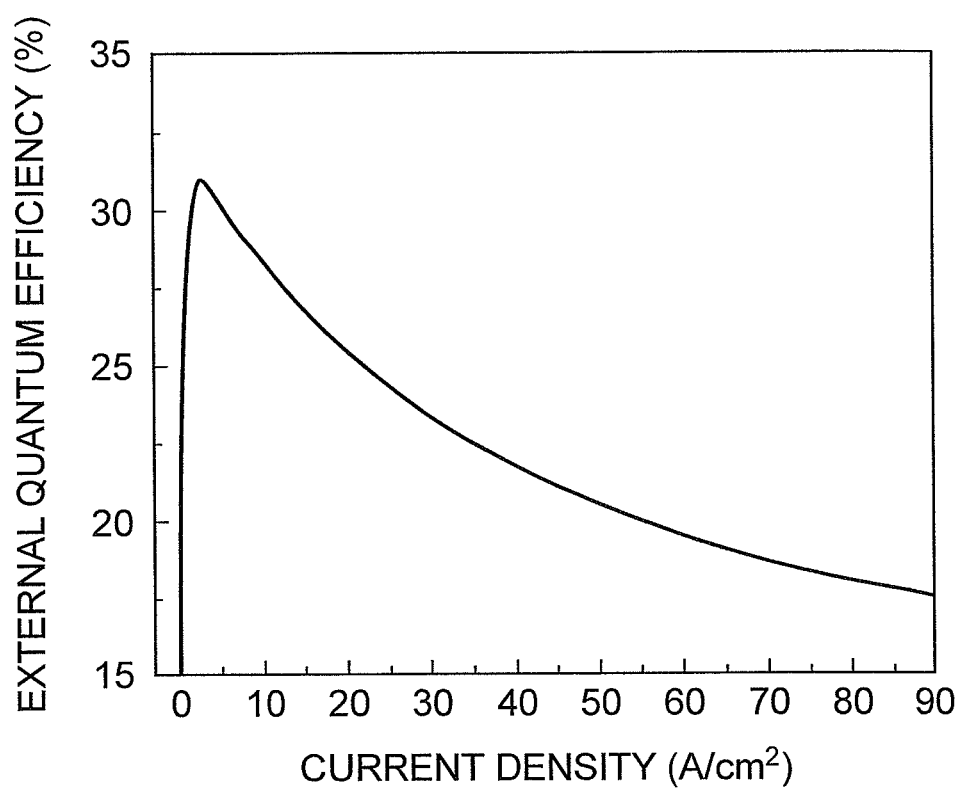
FIG. 17 is a graph showing an example relation between the current density and the external quantum efficiency in the GaN-based semiconductor light emitting device shown in FIG. 16.
Figure 18:
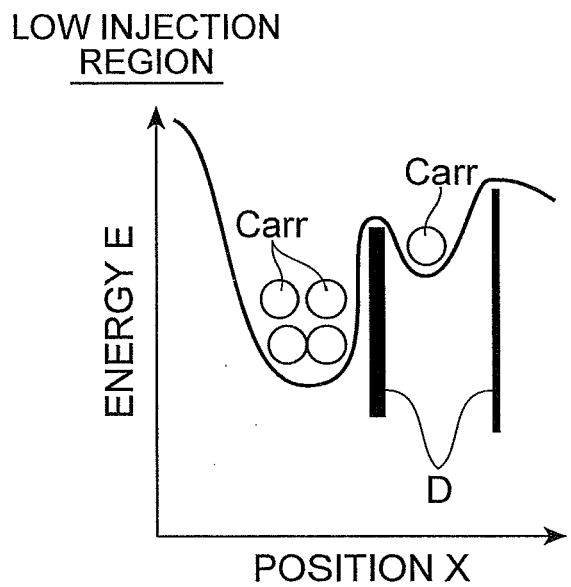
FIG. 18 is conceptual diagrams illustrating carrier accumulation at dislocation under relatively low current injection into a GaN-based semiconductor light emitting device (Part (a)), and under relatively high current injection (Part (b)).
Figure 18:
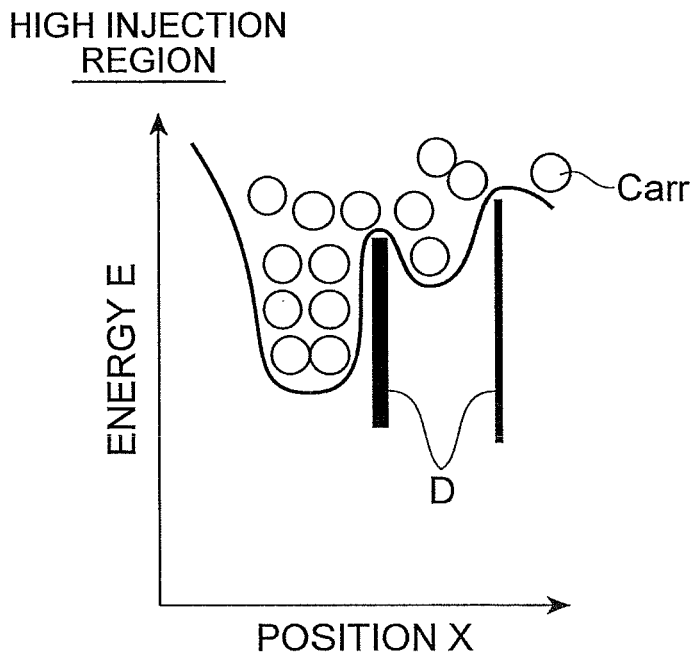

In the GaN-based semiconductor light emitting devices 11a and 11b and the method for making the GaN-based semiconductor light emitting device 11a, the primary surface 13a of the substrate 13 tilts from the c-axis of the GaN-based semiconductor toward the m-axis of the GaN-based semiconductor at a tilt angle α of more than or equal to 63 degrees and less than 80 degrees. FIG. 5 is a graph showing the relation between the tilt angle α of the primary surface and the piezoelectric field in the active layer 17. As shown in FIG. 5, the amplitude of the piezoelectric field in the active layer 17 provided on the primary surface 13a tilting from the c-plane at a tilt angle in the range R of 63 degrees to below 80 degrees is smaller than the amplitude of the piezoelectric field on the c-plane (which corresponds to a tile angle α=0°) in the active layer. The piezoelectric field in the active layer 17 also takes a negative value. That is, according to the embodiment, the direction of the piezoelectric field in the active layer 17 is opposite to the direction of an electric field induced by current injection. Thus, since the band bending B1 and B2 shown in Part (a) of FIG. 16 turns to the opposite direction, the localization of holes or the blocking of hole injection into the active layer 17 can be suppressed under relatively high current injection, thereby moderating a decrease in quantum efficiency.

In the GaN-based semiconductor light emitting devices 11a and 11b and the method for making the GaN-based semiconductor light emitting device 11a, the dislocation density in the first GaN-based semiconductor of the substrate 13 is $1 \times 10^{-7}$ cm$^{-2}$ or less. The GaN-based semiconductor epitaxial region 15, the active layer 17, the electron blocking layer 27, and the contact layer 29 are disposed on the substrate 13 composed of the high-quality GaN-based semiconductor having such a low dislocation density. Thus, since the dislocation density is low in the GaN-based semiconductor light emitting device 11a, trapping of carriers in dislocation can be reduced even under relatively high current injection, thereby moderating a decrease in quantum efficiency.

According to the embodiment explained above, the GaN-based semiconductor light emitting devices 11a and 11b and the method for making the GaN-based semiconductor light emitting device 11a can solve disadvantages of a conventional GaN-based semiconductor light emitting device, such as (1) the Auger process, (2) the depletion of holes caused by an electron blocking layer, and (3) a high dislocation density characteristic to a GaN-based light emitting device, thereby effectively moderating a decrease in quantum efficiency under high current injection.

Figure 6:
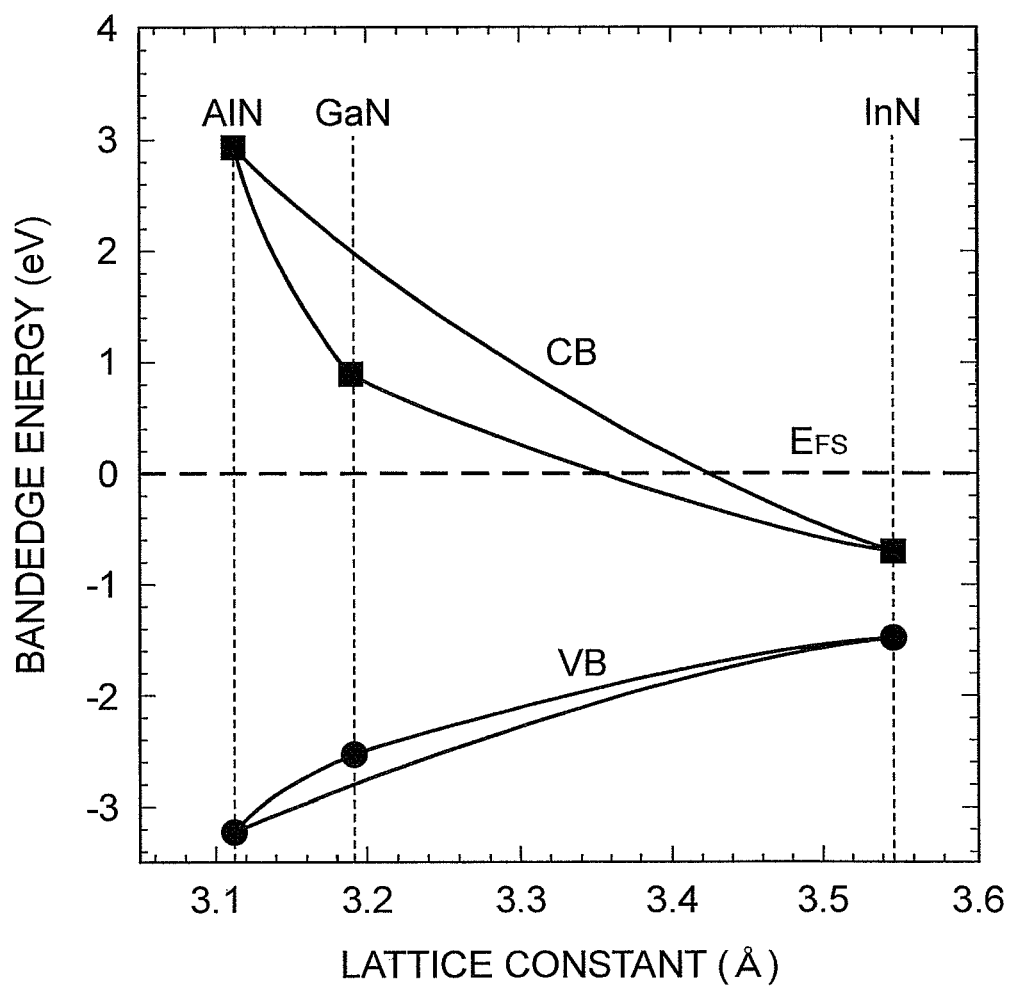
FIG. 6 is a graph showing the relation between the lattice constant of a GaN-based semiconductor and the band-edge energy.

According to the embodiment, the second GaN-based semiconductor of the active layer 17 preferably has a composition of $In_{x2}Al_{y2}Ga_{1-x2-y2}N$ (0<x2<1, 0<y2<1). FIG. 6 is a graph showing the relation between the lattice constant and the band-edge energy of the GaN-based semiconductor. As shown in FIG. 6, the lattice constant in the active layer 17 of $In_{x2}Al_{y2}Ga_{1-x2-y2}N$ (0<x2<1, 0<y2<1) can be freely chosen within a certain range by desirably modifying the amounts of indium (x2) and aluminum (y2) in the composition. Thus, since the amplitude of the anisotropic strain induced in the active layer 17 can be desirably controlled, the energy gap Δ between the energy level E3 and the bottom energy of the conduction band, shown in FIG. 4, can be effectively controlled.

According to the embodiment, the GaN-based semiconductor light emitting device may be a light emitting diode, like the GaN-based semiconductor light emitting device 11a. In this case, a planar chip size of the light emitting diode is preferably smaller than 500 μm square. In the GaN-based semiconductor light emitting device 11a and the method for making the same according to the embodiment, since a decrease in quantum efficiency due to the droop phenomenon is effectively moderated, the device can have high efficiency of light emission under a high current density, resulting in downsizing of the chip.

Example 1

Figure 7:
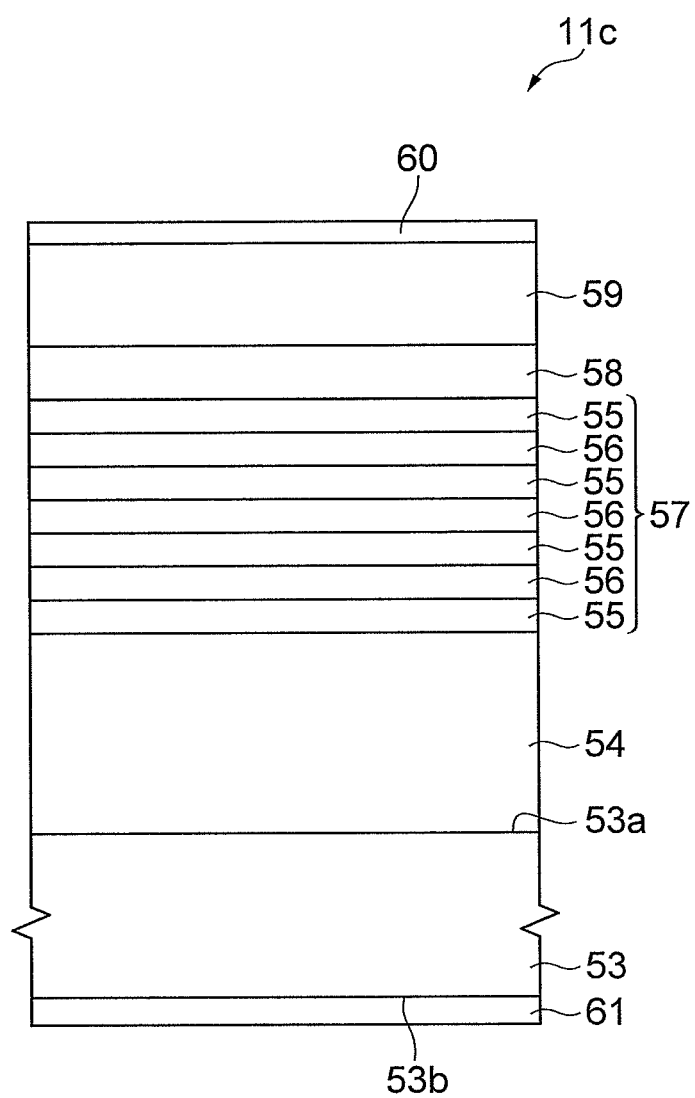
FIG. 7 is a cross-sectional view of a GaN-based semiconductor light emitting device provided with a low dislocation density semipolar GaN substrate, fabricated according to a first embodiment.

A GaN-based semiconductor light emitting device 11c having a cross-sectional structure shown in FIG. 7 was fabricated using a GaN substrate having a dislocation density of $1 \times 10^7$ cm$^{-2}$ or less and a primary surface tilting from the c-plane toward the m-axis at a tilt angle of 75 degrees, through the steps described below. In the following steps, NH$_3$, TMG, TMI, TMA, and Cp$_2$Mg were used as source materials.

After thermal treatment of a GaN substrate 53 at 1050° C. in an atmosphere of NH$_3$ and H$_2$ for 10 minutes, an n-type GaN buffer layer 54 having a thickness of 2 μm was grown on a primary surface 53a of the substrate 53 at 1000° C. An undoped GaN barrier layer 55 was grown at a reduced temperature of 870° C., and an undoped In$_{0.15}$Ga$_{0.85}$N well layer 56 was grown at 780° C. By repeating these steps, a multi-quantum well structure 57 having three periodicities was formed. Subsequently, a p-type Al$_{0.18}$Ga$_{0.82}$N electron blocking layer 58 having a thickness of 20 nm was grown on the active layer 57 at an elevated temperature of 1000° C. Finally, a p-type GaN contact layer 59 was grown on the electron blocking layer 58, and then the epitaxial wafer was brought out from the growth furnace after cooling.

A Ni/Au electrode 60 was then deposited on the p-type GaN contact layer 59, and a Ti/Al electrode 61 on the back surface 53b of the substrate 53. The GaN-based semiconductor light emitting device 11c was completed by dicing the epitaxial wafer into individual chips. The shape of the device viewed from the top was a 400 μm square.

Figure 8:
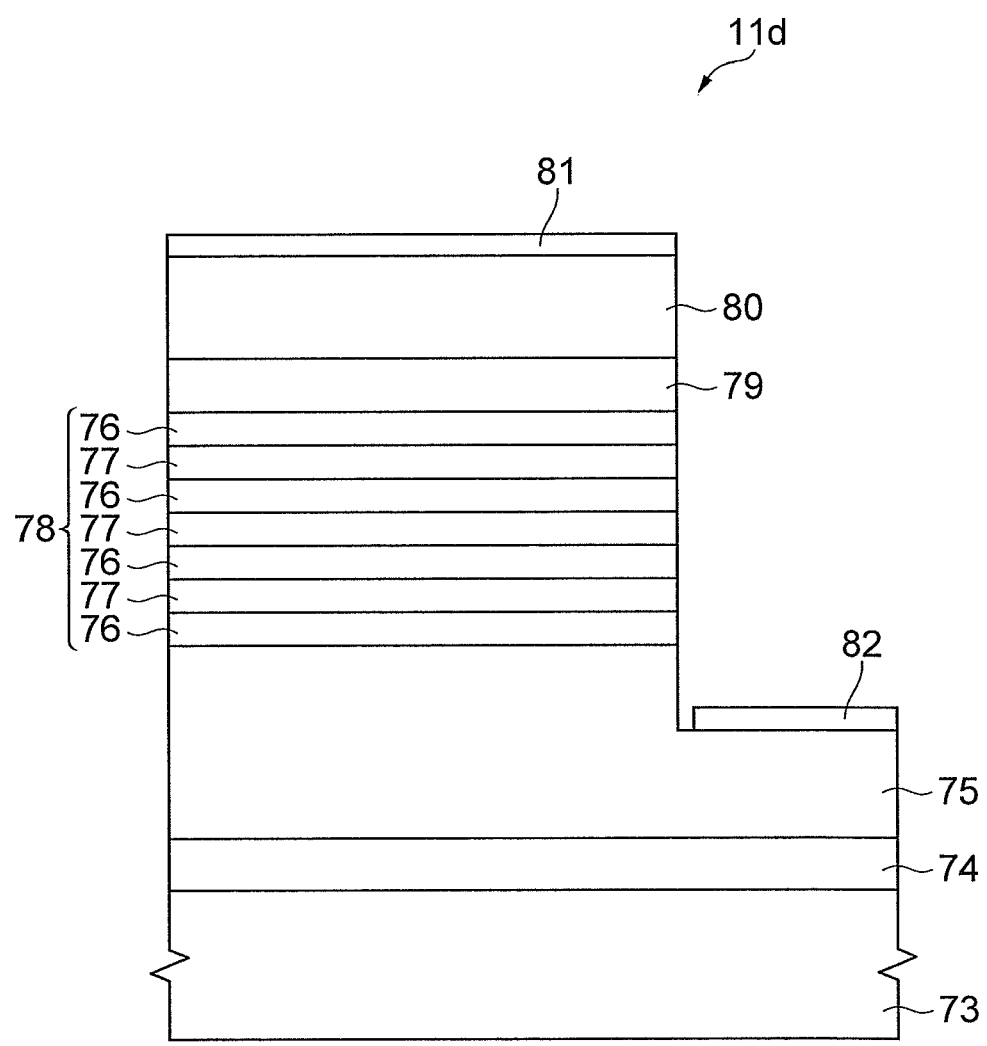
FIG. 8 is a cross-sectional view of a GaN-based semiconductor light emitting device provided with a c-plane sapphire substrate, fabricated according to a first embodiment.

In order to compare with the GaN-based semiconductor light emitting device 11c on the effects, a GaN-based semiconductor light emitting device 11d having a cross-sectional structure shown in FIG. 8 was fabricated using a sapphire substrate having the c-plane as a primary surface through the following steps.

A low-temperature buffer layer 74 having a thickness of 50 nm was grown on a primary surface 73a of a sapphire substrate 73 at 475° C. and an n-type GaN buffer layer 75 having a thickness of 5 μm was grown on the low-temperature buffer layer 74 at 1050° C. An undoped GaN barrier layer 76 was grown at a reduced temperature of 870° C., and an undoped $In_{0.15}Ga_{0.85}N$ well layer 77 was grown at 780° C. By repeating these steps, a multiquantum well structure 78 having three periodicities was formed. Subsequently, p-type $Al_{0.18}Ga_{0.82}N$ electron blocking layer 79 having a thickness of 20 nm was grown on the active layer 78 at an elevated temperature of 1000° C. Finally, a p-type GaN contact layer 80 was grown on the electron blocking layer 79, and then the epitaxial wafer was brought out from the growth furnace after cooling.

After the n-type GaN buffer layer 75 was partly exposed by etching, a Ni/Au electrode 81 was deposited on the p-type GaN contact layer 80, and a Ti/Al electrode 82 on the exposed surface of the n-type GaN buffer layer 75. The GaN-based semiconductor light emitting device 11d was completed by dicing the epitaxial wafer into individual chips. For precise comparison, the fabrication process was modified to achieve light extraction efficiency close to the light extraction efficiency of the GaN-based semiconductor light emitting device 11c. The emission wavelengths were 460 nm in the GaN-based semiconductor light emitting devices 11c and 11d.

Figure 9:
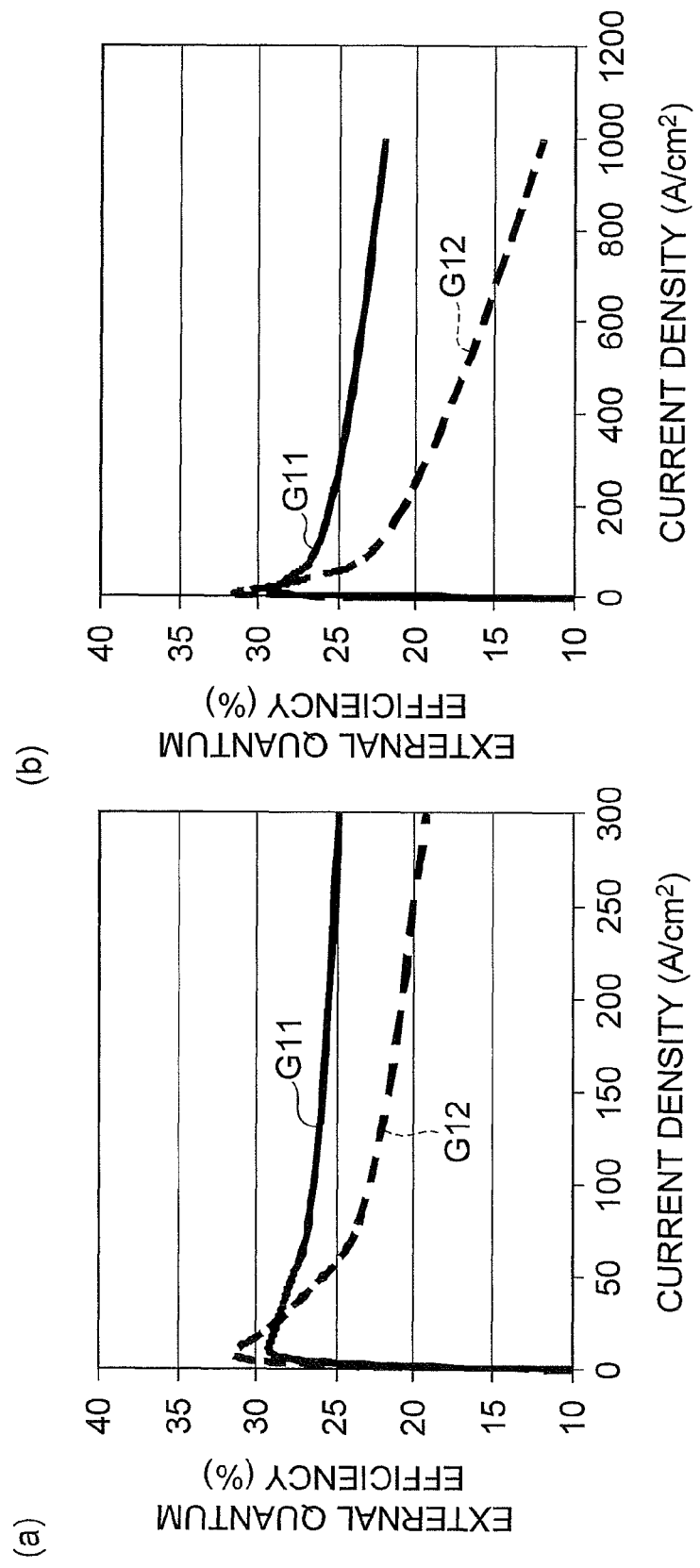
FIG. 9 is a graph showing the dependence of external quantum efficiency on the current density in a GaN-based semiconductor light emitting device fabricated according to a first embodiment. In Part (a) of FIG. 9, the current density (horizontal axis) ranges from 0 to 300 A/cm². In Part (b) of FIG. 9, the current density (horizontal axis) ranges from 0 to 1200 A/cm².

The dependence of the external quantum efficiency on the current density was measured after current was injected into the GaN-based semiconductor devices 11c and 11d fabricated in the steps explained above. FIG. 9 shows the results of the measurements. In Part (a) of FIG. 9, a current density (a horizontal axis) ranges from 0 to 300 A/cm². In Part (b) of FIG. 9, a current density (a horizontal axis) ranges from 0 to 1200 A/cm². In Parts (a) and (b) of FIG. 9, the lines G11 represent a characteristic curve of the GaN-based semiconductor light emitting device 11c (the low dislocation density semipolar GaN substrate was used), and the lines G12 represent a characteristic curve of the GaN-based semiconductor light emitting device 11d (the c-plane sapphire substrate was used).

With reference to FIG. 9, the GaN-based semiconductor light emitting device 11d (the c-plane sapphire substrate) has higher external quantum efficiency than the GaN-based semiconductor light emitting device 11c (the low dislocation density semipolar GaN substrate) at an injected current of 1 A/cm². After the injected current is increased to about 30 A/cm², this relation is reversed and the GaN-based semiconductor light emitting device 11c (the low dislocation density semipolar GaN substrate) has higher external quantum efficiency than the GaN-based semiconductor light emitting device 11d (the c-plane sapphire substrate). At an injected current over 30 A/cm², the difference in the quantum efficiency between the GaN-based quantum light emitting devices 11c and 11d is increased as the injected current increases. For example, at an injected current in the range of 1 A/cm² to 1 kA/cm², the external quantum efficiency decreases to about ½ to about ⅓ in the GaN-based semiconductor light emitting device 11d (the c-plane sapphire substrate). In the GaN-based semiconductor device 11c (the low dislocation density semipolar GaN substrate), the external quantum efficiency decreases merely to about ⅔ to ½. These results reveal that the droop phenomenon is efficiently suppressed in the GaN-based semiconductor light emitting device 11c. The GaN-based semiconductor light emitting device 11d has larger external quantum efficiency than the GaN-based semiconductor light emitting device 11c under low current injection probably because of the localization effect due to large nonuniformity of the indium distribution.

Example 2

GaN-based semiconductor light emitting devices 11c and 11d respectively provided with well layers 56 (FIG. 7) and well layers 77 (FIG. 8) were fabricated, each well layer having a different composition from the GaN-based semiconductor light emitting devices in Example 1. In one example (Example A), the well layers 56 and the well layers 77 having a composition of $In_{0.18}Ga_{0.82}N$ were grown at 760° C. In Example A, the emission wavelengths were 480 nm. In another example (Example B), the well layers 56 and the well layers 77 having a composition of $In_{0.22}Ga_{0.78}N$ were grown at 740° C. In Example B, the emission wavelengths were 500 nm. In the other example (Example C), the well layers 56 and the wall layers 77 having a composition of $In_{0.28}Ga_{0.72}N$ were grown at 720° C. In Example C, the emission wavelengths were 520 nm.

Figure 10:
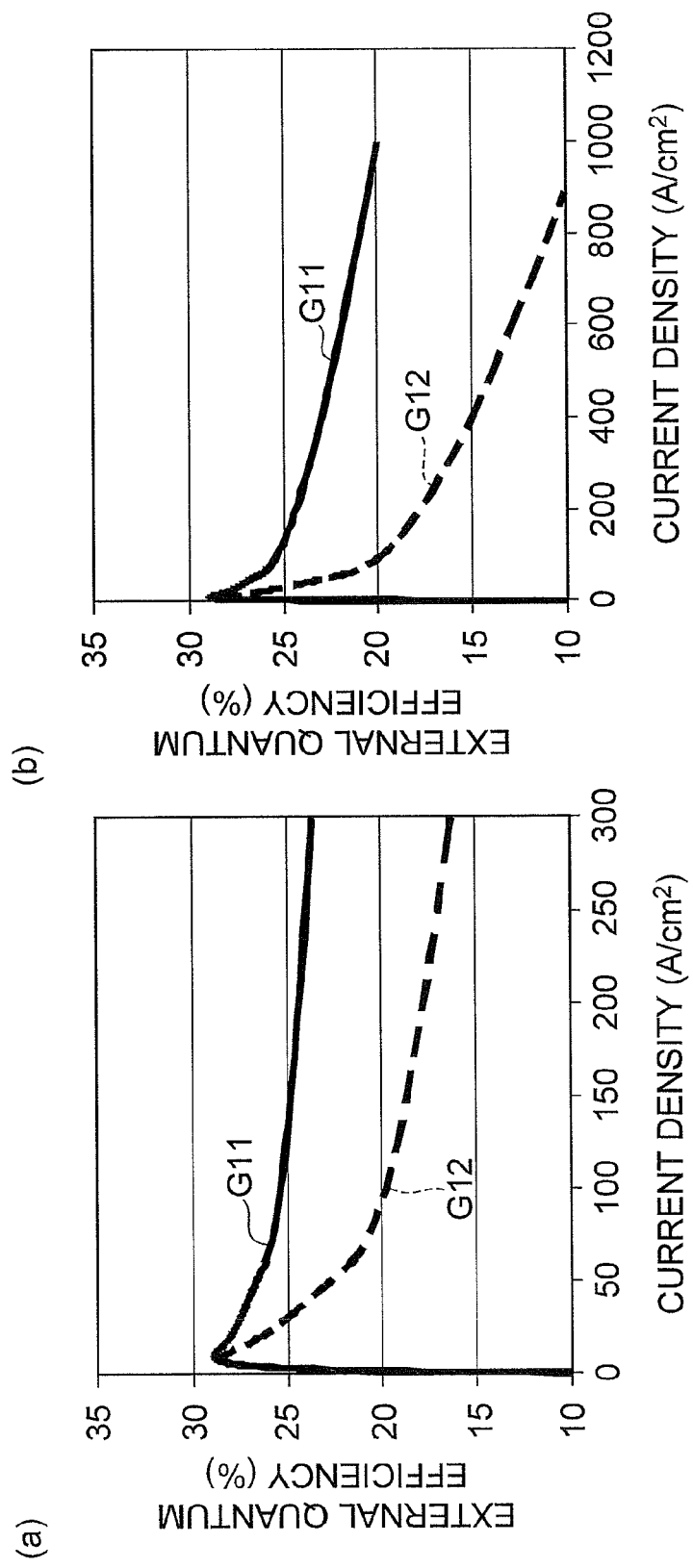
FIG. 10 is a graph showing the dependence of external quantum efficiency on the current density in a GaN-based semiconductor light emitting device fabricated according to a second embodiment. In Part (a) of FIG. 10, the current density (horizontal axis) ranges from 0 to 300 A/cm². In Part (b) of FIG. 10, the current density (horizontal axis) ranges from 0 to 1200 A/cm².
Figure 11:
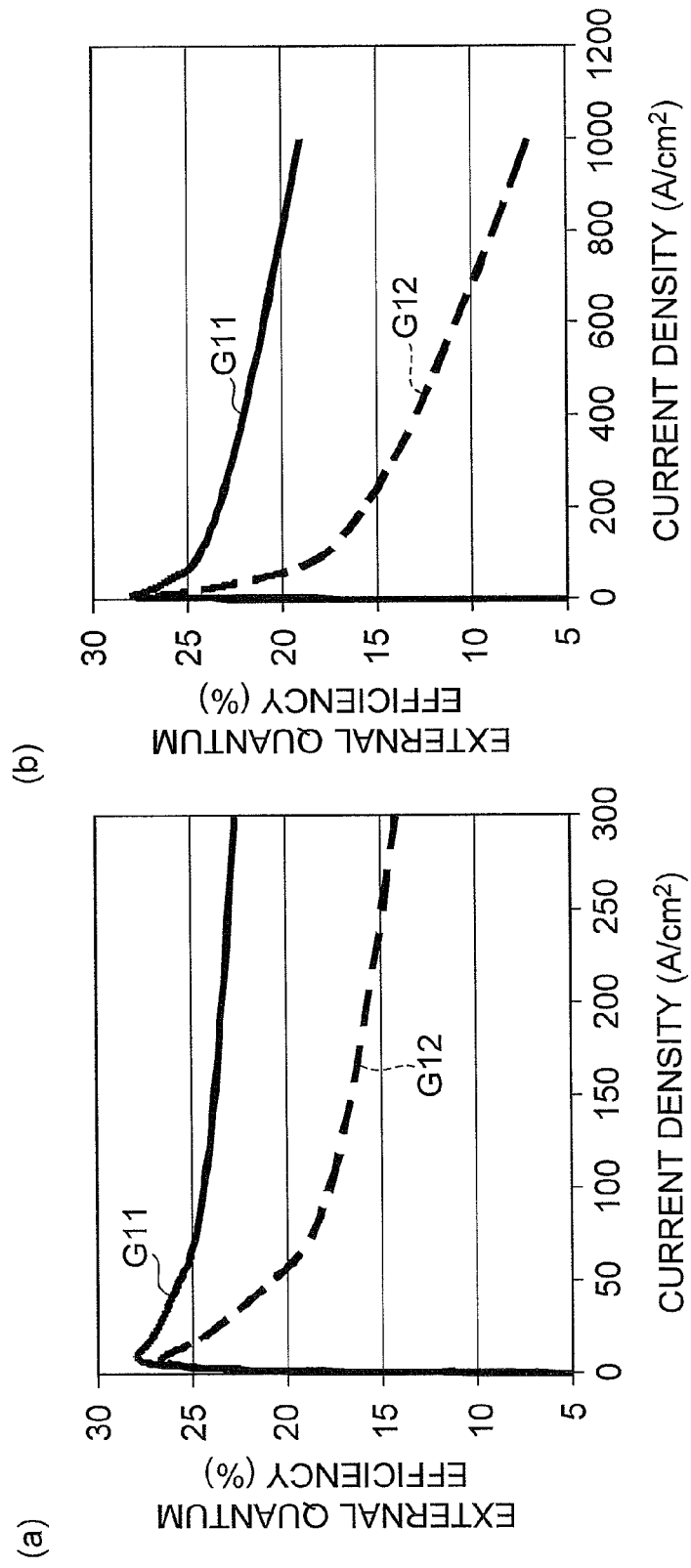
FIG. 11 is a graph showing the dependence of external quantum efficiency on the current density in a GaN-based semiconductor light emitting device fabricated according to a second embodiment. In Part (a) of FIG. 11, the current density (horizontal axis) ranges from 0 to 300 A/cm². In Part (b) of FIG. 11, the current density (horizontal axis) ranges from 0 to 1200 A/cm².
Figure 12:
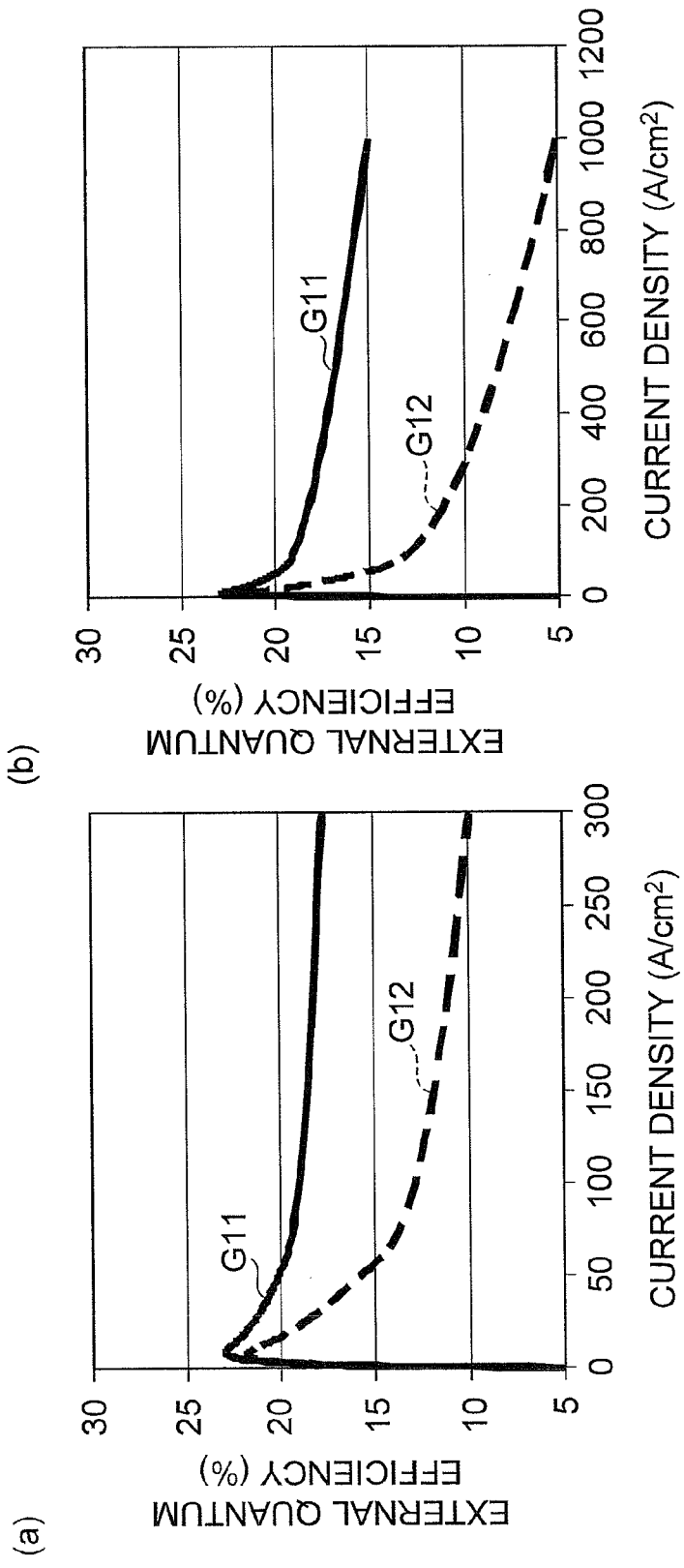
FIG. 12 is a graph showing the dependence of external quantum efficiency on the current density in a GaN-based semiconductor light emitting device fabricated according to a second embodiment. In Part (a) of FIG. 12, the current density (horizontal axis) ranges from 0 to 300 A/cm². In Part (b) of FIG. 12, the current density (horizontal axis) ranges from 0 to 1200 A/cm².
Figure 13:
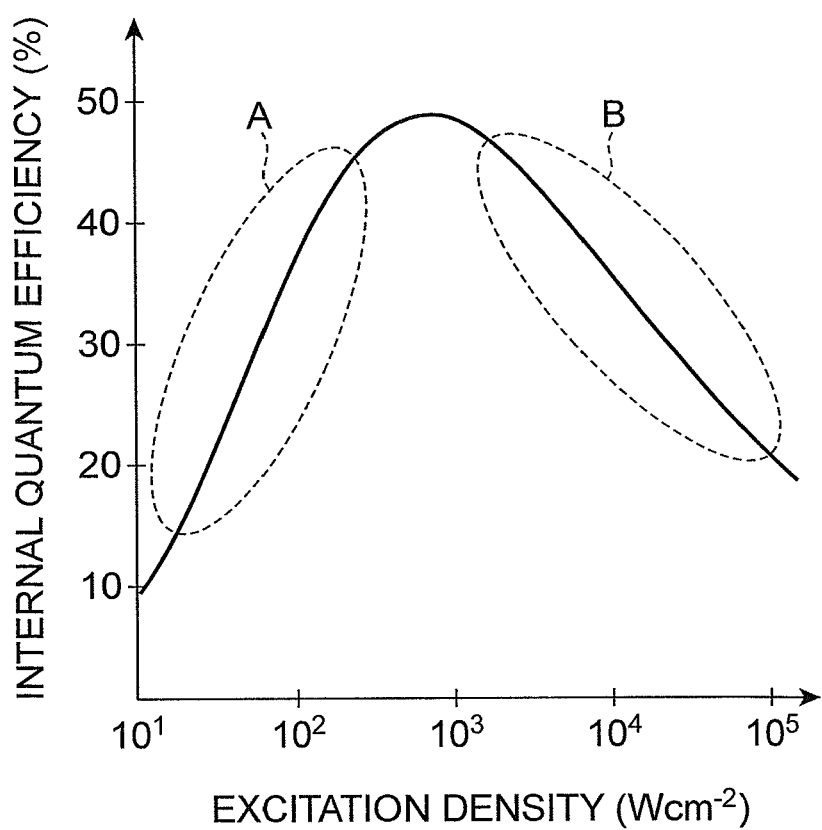
FIG. 13 is an example graph showing the relation between the excitation density and the internal quantum efficiency in a conventional light emitting device.

FIGS. 10 to 12 are graphs showing the dependence of the external quantum efficiency on the current density in the GaN-based semiconductor light emitting devices. FIGS. 10 to 12 correspond to Examples A to C, respectively. In graph (a) in each drawing, the current density (horizontal axes) ranges from 0 to 300 A/cm². In graph (b), the current density (horizontal axes) ranges from 0 to 1200 A/cm². In FIGS. 10 to 12, the lines G11 represent a characteristic curve of the GaN-based semiconductor light emitting device 11c (the low dislocation density semipolar GaN substrate was used), and the lines G12 represent a characteristic curve of the GaN-based semiconductor light emitting device 11d (the c-plane sapphire substrate was used).

As shown in FIGS. 10 to 12, the effects explained in Example 1 are remarkably exhibited by the GaN-based semiconductor light emitting devices provided with the well layers having different compositions. That is, in the GaN-based semiconductor light emitting device 11c, the droop phenomenon is effectively suppressed.

As explained above, according to the embodiments, a GaN-based semiconductor light emitting device having an active layer containing indium and a method for making the same can be provided, in which a decrease in quantum efficiency under high current injection can be moderated.

REFERENCE SIGNS LIST 11a-11d: GaN-based semiconductor device
13: substrate
13a: primary surface
15: GaN-based semiconductor epitaxial region
17: active layer
21: GaN-based semiconductor region
23: p-type GaN-based semiconductor layer
27, 45: electron blocking layer
29: contact layer
31: multiquantum well structure
33: well layer
35: barrier layer
37, 39, 51, 52: electrode
41: n-type cladding layer
43a, 43b: light guiding layer
45: p-type GaN-based semiconductor layer
47: cladding layer
49: contact layer 50: insulating layer
Carr: carrier
D: dislocation
e1, e2: electron
hole: hole
α: tilt angle

What is claimed is:

1. A GaN-based semiconductor light emitting device, comprising:
a substrate of a first GaN-based semiconductor having a primary surface, the primary surface tilting from a plane normal to a reference axis being the axis [0 0 0 1] or [0 0 0 −1] of the first GaN-based semiconductor toward the m-axis of the first GaN-based semiconductor at a tilt angle of more than or equal to 63 degrees and less than 80 degrees;
a GaN-based semiconductor epitaxial region provided on the primary surface;
an active layer provided on the GaN-based semiconductor epitaxial region;
an electron blocking layer provided on the active layer; and
a contact layer provided on the electron blocking layer,
wherein:
the active layer comprises a second GaN-based semiconductor, the second GAN-based semiconductor containing indium;
the electron blocking layer comprises a third GaN-based semiconductor, the third GaN-based semiconductor having a bandgap larger than the bandgap of the second GaN-based semiconductor;
the contact layer comprises of a fourth GaN-based semiconductor, the fourth GaN-based semiconductor having a bandgap equal to or less than the bandgap of the third GaN-based semiconductor; and
the first GaN-based semiconductor of the substrate has a dislocation density of $1 \times 10^7$ cm$^2$ or less.

2. The GaN-based semiconductor light emitting device according to claim 1, wherein the tilt angle of the substrate is 70 degrees or more.

3. The GaN-based semiconductor light emitting device according to claim 1, wherein the active layer is provided so as to emit light of a wavelength range of 400 nm to 650 nm.

4. The GaN-based semiconductor light emitting device according to claim 3, wherein the active layer is provided so as to emit light of a wavelength range of 440 nm to 540 nm.

5. The GaN-based semiconductor light emitting device according to claim 4, wherein the active layer is provided so as to emit light of a wavelength range of 440 nm to 490 nm.

6. The GaN-based semiconductor light emitting device according to claim 1, wherein the second GaN-based semiconductor comprises $In_{x2}Al_{y2}Ga_{1-x2-y2}N$ (0<x2<1, 0<y2<1).

7. The GaN-based semiconductor light emitting device according to claim 1, wherein the third GaN-based semiconductor comprises $In_{x3}Al_{y3}Ga_{1-x3-y3}N$ (0≦x3≦1, 0≦y3≦1), and the lattice constant of the third GaN-based semiconductor is equal to or less than the lattice constant of the first GaN-based semiconductor.

8. The GaN-based semiconductor light emitting device according to claim 1, wherein the GaN-based semiconductor light emitting device is a light emitting diode.

9. The GaN-based semiconductor light emitting device according to claim 8, wherein the chip size of the light emitting diode is less than 500 μm square.

10. A method for making a GaN-based semiconductor light emitting device, comprising the steps of:
growing a GaN-based semiconductor epitaxial region on a primary surface of a wafer composed of a first GaN-based semiconductor;
growing an active layer on the GaN-based semiconductor epitaxial region;
growing an electron blocking layer on the active layer; and
growing a contact layer on the electron blocking layer,
wherein:
the primary surface of the wafer tilts from a plane normal to a reference axis being the axis [0 0 0 1] or [0 0 0 −1] of the first GaN-based semiconductor toward the m-axis of the first GaN-based semiconductor at a tilt angle of more than or equal to 63 degrees and less than 80 degrees;
the active layer comprises a second GaN-based semiconductor, the second GaN-based semiconductor containing indium;
the electron blocking layer comprises a third GaN-based semiconductor, the third GaN-based semiconductor having a bandgap larger than the bandgap of the second GaN-based semiconductor;
the contact layer comprises a fourth GaN-based semiconductor, the fourth GaN-based semiconductor having a bandgap equal to or less than the bandgap of the third GaN-based semiconductor;
the first GaN-based semiconductor of the wafer has a dislocation density of $1 \times 10^7$ cm$^{-2}$ or less.

11. The method for making the GaN-based semiconductor light emitting device according to claim 10, wherein the tilt angle of the primary surface of the wafer is 70 degrees or more.

12. The method for making the GaN-based semiconductor light emitting device according to claim 10, wherein the active layer is provided so as to emit light of a wavelength range of 400 nm to 650 nm.

13. The method for making the GaN-based semiconductor light emitting device according to claim 12, wherein the active layer is provided so as to emit light of a wavelength range of 440 nm to 540 nm.

14. The method for making the GaN-based semiconductor light emitting device according to claim 13, wherein the active layer is provided so as to emit light of a wavelength range of 440 nm to 490 nm.

15. The method for making the GaN-based semiconductor light emitting device according to claim 10, wherein the second GaN-based semiconductor comprises $In_{x2}Al_{y2}Ga_{1-x2-y2}N$ (0<x2<1, 0<y2<1).

16. The method for making the GaN-based semiconductor light emitting device according to claim 10, wherein the third GaN-based semiconductor comprises $In_{x3}Al_{y3}Ga_{1-x3-y3}N$ (0≦x3≦1, 0≦y3≦1), and the lattice constant of the third GaN-based semiconductor is equal to or less than the lattice constant of the first GaN-based semiconductor.

17. The method for making the GaN-based semiconductor light emitting device according to claim 10, wherein the GaN-based semiconductor light emitting device is a light emitting diode.

18. The method for making the GaN-based semiconductor light emitting device according to claim 17, wherein the light emitting diode has a chip size of less than 500 μm square.

* * * * *